(12) United States Patent
Bae et al.

(10) Patent No.: US 12,114,529 B2
(45) Date of Patent: Oct. 8, 2024

(54) DISPLAY APPARATUS

(71) Applicant: Samsung Display Co., Ltd., Yongin-si (KR)

(72) Inventors: Kwangsoo Bae, Yongin-si (KR); Junyong Song, Yongin-si (KR); Minjeong Oh, Yongin-si (KR); Jinho Ju, Yongin-si (KR); Sanghyun Choi, Yongin-si (KR); Chaungi Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 141 days.

(21) Appl. No.: 17/348,457

(22) Filed: Jun. 15, 2021

(65) Prior Publication Data
US 2022/0045137 A1 Feb. 10, 2022

(30) Foreign Application Priority Data

Aug. 10, 2020 (KR) .................. 10-2020-0099940

(51) Int. Cl.
| | |
|---|---|
| *H10K 59/121* | (2023.01) |
| *G06F 3/041* | (2006.01) |
| *G09G 3/3233* | (2016.01) |
| *H10K 59/124* | (2023.01) |
| *H10K 59/131* | (2023.01) |

(Continued)

(52) U.S. Cl.
CPC ......... *H10K 59/121* (2023.02); *H10K 59/124* (2023.02); *H10K 59/131* (2023.02); *H10K 59/40* (2023.02); *H10K 77/111* (2023.02); *G06F 3/0412* (2013.01); *G09G 3/3233* (2013.01); *G09G 2300/0421* (2013.01);
(Continued)

(58) Field of Classification Search
CPC .... H10K 59/40; H10K 59/121; H10K 59/124; H10K 59/353; H10K 59/131; H10K 77/111; G09G 3/3233; G09G 2300/0842; G09G 2300/0439; G09G 2300/0421; G06F 3/0412; Y02E 10/549
See application file for complete search history.

(56) References Cited

U.S. PATENT DOCUMENTS

| | | | |
|---|---|---|---|
| 7,446,462 | B2 | 11/2008 | Lim et al. |
| 10,347,702 | B2 | 7/2019 | Youn et al. |

(Continued)

FOREIGN PATENT DOCUMENTS

| | | |
|---|---|---|
| EP | 3486948 | 5/2019 |
| KR | 10-0624307 | 9/2006 |

(Continued)

*Primary Examiner* — Vongsavanh Sengdara
(74) *Attorney, Agent, or Firm* — KILE PARK REED & HOUTTEMAN PLLC

(57) ABSTRACT

A display apparatus includes: a substrate; at least one inorganic layer disposed on the substrate and including a first area, a second area, and an elongated recess disposed between the first area and the second area, the first area and the second area being adjacent to each other in a first direction; an organic material disposed in the recess; a plurality of first pixel electrodes disposed on the first area of the inorganic layer; and a plurality of second pixel electrodes disposed on the second area of the inorganic layer. The number of the plurality of first pixel electrodes and the number of the plurality of second pixel electrodes are different from each other.

28 Claims, 21 Drawing Sheets

(51) Int. Cl.
*H10K 59/40* (2023.01)
*H10K 77/10* (2023.01)
*H10K 102/00* (2023.01)

(52) U.S. Cl.
CPC .............. *G09G 2300/0439* (2013.01); *G09G 2300/0842* (2013.01); *H10K 2102/311* (2023.02)

(56) References Cited

U.S. PATENT DOCUMENTS

| | | | |
|---|---|---|---|
| 11,177,335 | B2 | 11/2021 | Park et al. |
| 2014/0175399 | A1* | 6/2014 | Choi .................... H10K 59/124 |
| | | | 257/40 |
| 2014/0312319 | A1* | 10/2014 | Kim .................... H10K 59/121 |
| | | | 257/40 |
| 2014/0367655 | A1* | 12/2014 | Takii ................. H10K 59/8794 |
| | | | 438/34 |
| 2016/0365531 | A1* | 12/2016 | Hu ................... H10K 59/80515 |
| 2017/0005286 | A1* | 1/2017 | Yun ........................ H10K 59/35 |
| 2018/0182827 | A1 | 6/2018 | Kim |
| 2018/0197929 | A1* | 7/2018 | Cho .................... H10K 59/353 |
| 2018/0342570 | A1* | 11/2018 | Hong ................ H10K 59/1216 |
| 2019/0027612 | A1* | 1/2019 | Zhang ................ H01L 27/1248 |
| 2019/0148476 | A1* | 5/2019 | Park ................... H01L 27/1222 |
| | | | 257/40 |

FOREIGN PATENT DOCUMENTS

| | | |
|---|---|---|
| KR | 10-2016-0047132 | 5/2016 |
| KR | 10-2019-0055868 | 5/2019 |
| KR | 10-2020-0006647 | 1/2020 |

\* cited by examiner

FIG. 13

| | 0° | | 45° | | 90° | | 135° | | 180° | |
|---|---|---|---|---|---|---|---|---|---|---|
| | Inclination propagation direction (High → Low) | Inclination bias | Inclination propagation direction (High → Low) | Inclination bias | Inclination propagation direction (High → Low) | Inclination bias | Inclination propagation direction (High → Low) | Inclination bias | Inclination propagation direction (High → Low) | Inclination bias |
| R1 | LeftR/LeftB/RightR/RightB/CenterB | R,B=0 | | | CenterB/LeftR/RightB/CenterR/LeftB/RightR | R,B=0 | | | LeftG/RightG/RightG/CenterG/LeftG | |
| R2 | RightG/CenterG/LeftG/LeftG/RightG | G=0 | R=Left5, Right5<br>B=Left5, Right5<br>G=Left10, Right10 | R→0<br>B→0<br>G→0 | LeftG/RightG/CenterG/LeftG/RightG/CenterG | G=0 | R=Left5, Right5<br>B=Left5, Right5<br>G=Left10, Right10 | R→0<br>B→0<br>G→0 | CenterB/LeftR/LeftB/RightR/RightB | G=0 |
| R3 | LeftB/LeftR/RightB/RightR/CenterR | R,B=0 | | | CenterR/LeftB/RightR/CenterB/LeftR/RightB | R,B=0 | | | LeftG/RightG/RightG/CenterG/LeftG | R,B=0 |
| R4 | RightG/CenterG/LeftG/LeftG/RightG | G=0 | | | LeftG/RightG/CenterG/LeftG/RightG/CenterG | G=0 | | | CenterB/LeftR/LeftB/RightR/RightB | G=0 |

DISPLAY APPARATUS

CROSS-REFERENCE TO RELATED APPLICATION

This application claims priority from and the benefit of Korean Patent Application No. 10-2020-0099940, filed on Aug. 10, 2020, which is hereby incorporated by reference for all purposes as if fully set forth herein.

BACKGROUND

Field

Embodiments of the invention relate generally to display apparatus, and more particularly, to flexible display apparatus.

Discussion of the Background

In general, a display apparatus includes a display device and electronic devices for controlling an electrical signal applied to the display device. The electronic devices include a thin film transistor (TFT), a storage capacitor, and a plurality of signal lines.

Recently, the display apparatus has been used for various purposes. Also, as the display apparatus has become thinner and lighter, its range of use has widened. As the range of use of the display apparatus has been diversified, various methods have been researched to design the shape of the display apparatus.

The above information disclosed in this Background section is only for understanding of the background of the inventive concepts, and, therefore, it may contain information that does not constitute prior art.

SUMMARY

Applicant discovered that external visibility of light is degraded in certain flexible display apparatus of the related art that includes embedded material for improving flexibility.

Display apparatus constructed according to the principles and exemplary implementations of the invention have improved flexibility and improved external visibility. For example, the display apparatus may include an inorganic layer including recesses defining a plurality of areas and extending over the display area, an organic material disposed in the recesses to enhance flexibility, and pixel electrodes overlapping the plurality of areas. The pixel electrodes are arranged on the plurality of areas of the inorganic layer in unique configurations that improves external visibility without adversely affecting the flexibility provided by the organic material in the recesses.

Additional features of the inventive concepts will be set forth in the description which follows, and in part will be apparent from the description, or may be learned by practice of the inventive concepts.

According to one aspect of the invention, a display apparatus includes: a substrate; at least one inorganic layer disposed on the substrate and including a first area, a second area, and an elongated recess disposed between the first area and the second area, the first area and the second area being adjacent to each other in a first direction; an organic material disposed in the elongated recess; a plurality of first pixel electrodes disposed on the first area of the inorganic layer; and a plurality of second pixel electrodes disposed on the second area of the inorganic layer. The number of the plurality of first pixel electrodes and the number of the plurality of second pixel electrodes are different from each other.

The elongated recess may include one or more grooves having a lattice shape.

The one or more grooves may include a branch point having four branches.

The inorganic layer may include an inorganic insulating layer and the organic material may include an organic material layer, and the first area and the second area of the inorganic insulating layer may be surrounded and isolated from each other by the elongated recess.

The display apparatus may further include a barrier layer located between the substrate and the inorganic layer, and the elongated recess may expose at least a portion of the barrier layer.

The number of the plurality of first pixel electrodes may be three, and the number of the plurality of second pixel electrodes may be four or five.

At least one of the plurality of first pixel electrodes may have a downward inclination in a direction toward the elongated recess.

At least one of the plurality of second pixel electrodes may have a downward inclination in a direction toward the elongated recess.

At least one of the plurality of first pixel electrodes may include a first portion adjacent to the elongated recess, a second portion disposed opposite the first portion, and a downward inclination from the second portion toward the first portion.

The display apparatus may further include a plurality of third pixel electrodes and a plurality of fourth pixel electrodes. The inorganic layer may further include a third area and a fourth area divided by the elongated recess, the third area and the fourth area being arranged adjacent to the second area in the first direction. The plurality of third pixel electrodes may be arranged over the third area of the inorganic layer, the plurality of fourth pixel electrodes may be arranged over the fourth area of the inorganic layer, and the number of the plurality of third pixel electrodes and the number of the plurality of fourth pixel electrodes may be different from each other.

The number of the plurality of third pixel electrodes may be three, and the number of the plurality of fourth pixel electrodes may be four or five.

The number of the plurality of third pixel electrodes may be four or five, and the number of the plurality of fourth pixel electrodes may be three.

The first to fourth areas may be sequentially arranged in the first direction in at least one or more rows in a second direction intersecting with the first direction, and the first to the fourth areas may include a repeating unit pattern of 4×4 matrix.

The plurality of first pixel electrodes, the plurality of second pixel electrodes, the plurality of third pixel electrodes, and the plurality of fourth pixel electrodes may be included in a plurality of pixels of the repeating unit pattern, a ratio of the number of pixels of a first color including pixel electrodes having a downward inclination in the first direction to the number of pixels of the first color including pixel electrodes having a downward inclination in a second direction opposite to the first direction may be about 1:1.

The display apparatus may further include a plurality of third pixel electrodes, fourth pixel electrodes, fifth pixel electrodes, and sixth pixel electrodes. The inorganic layer may further include third to sixth areas divided by the elongated recess, the third to sixth areas being arranged adjacent to the second area in the first direction. The plurality of third pixel electrodes may be arranged over the third area of the inorganic layer, the plurality of fourth pixel electrodes may be arranged over the fourth area of the inorganic layer, the plurality of fifth pixel electrodes may be arranged over the fifth area of the inorganic layer, the plurality of sixth pixel electrodes may be arranged over the sixth area of the inorganic layer, and the number of the plurality of third pixel electrodes may be equal to the number of the plurality of fourth pixel electrodes.

The number of the plurality of fifth pixel electrodes and the number of the plurality of sixth pixel electrodes may be different from each other.

The number of the plurality of third pixel electrodes, the number of the plurality of fourth pixel electrodes, and the number of the plurality of sixth pixel electrodes may be each 3, and the number of the plurality of fifth pixel electrodes may be four or five.

The plurality of first pixel electrodes and the plurality of second pixel electrodes may be arranged in a pentile type pattern.

The display apparatus may further include a line to apply signal or voltage, the line being arranged in the first direction or in a second direction intersecting the first direction. At least a portion of the line may be arranged across the organic material.

According to another aspect of the invention, a display apparatus includes: a circuit layer disposed on a substrate and including a plurality of first pixel circuits, a plurality of second pixel circuits, and at least one inorganic layer including a recess disposed between the plurality of first pixel circuits and the plurality of second pixel circuits; an organic material disposed in the recess; a plurality of first display elements arranged over the circuit layer and electrically connected to the plurality of first pixel circuits; and a plurality of second display elements adjacent to the plurality of first display elements and arranged over the circuit layer, the plurality of second display elements being electrically connected to the plurality of second pixel circuits. The number of the plurality of first display elements and the number of the plurality of second display elements may be different from each other.

According to still another aspect of the invention, a display apparatus includes: a substrate including a display area; an inorganic layer disposed on the substrate and including a plurality of areas and a recess dividing the plurality of areas into a lattice shape; an organic material disposed in the recess; and a plurality of pixel electrodes to emit light of substantially the same color, the plurality of pixel electrodes being arranged over the inorganic layer and overlapping the plurality of areas. The plurality of pixel electrodes includes a plurality of first pixel electrodes having a downward inclination in a first direction and a plurality of second pixel electrodes having a downward inclination in a second direction opposite to the first direction.

A ratio of the number of the plurality of first pixel electrodes to the number of the plurality of second pixel electrodes may be about 1:1.

The plurality of first pixel electrodes adjacent to the recess in the first direction, and the plurality of second pixel electrodes adjacent to the recess in the second direction have downward inclinations toward the recess.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 13 is a table schematically illustrating reflection color differences of the pixel unit for each rotation angle derived in the test process of FIG. 11.

DETAILED DESCRIPTION

Figure 1:
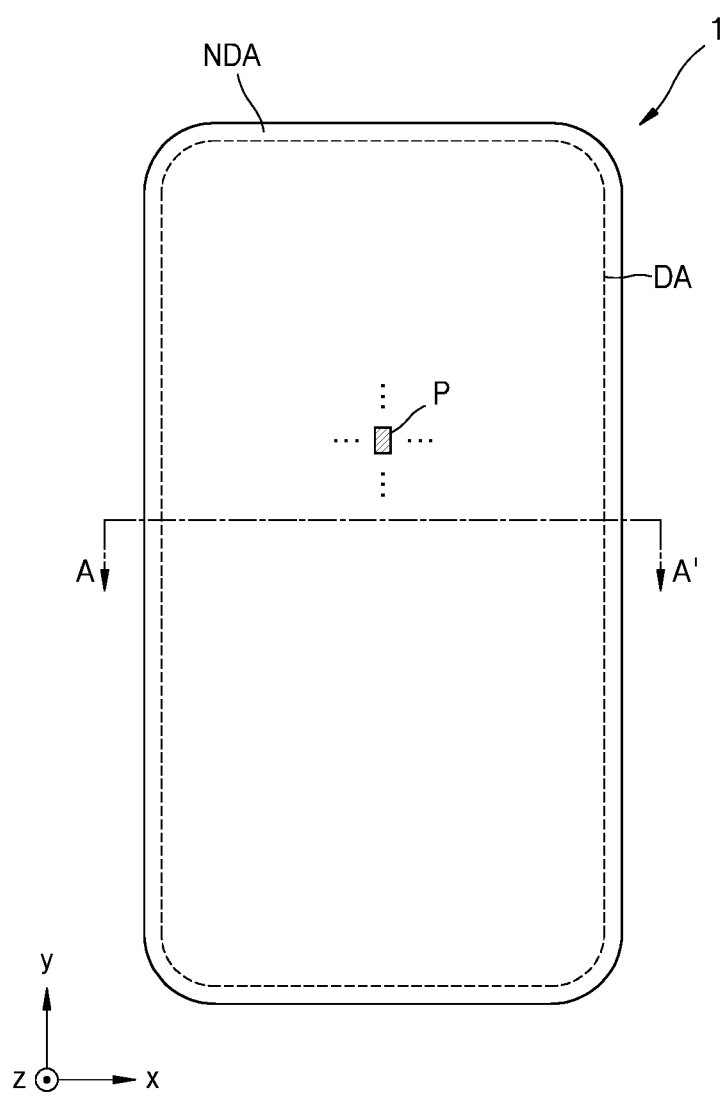
FIG. 1 is a plan view of an embodiment of a display apparatus constructed according to the principles of the invention.

In the following description, for the purposes of explanation, numerous specific details are set forth in order to provide a thorough understanding of various illustrative embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a display apparatus constructed according to the principles of the invention.

Referring to FIG. 1, a display apparatus 1 may include a display area DA and a peripheral area NDA outside the display area DA. A plurality of pixels P including display elements may be arranged in the display area DA, and the display apparatus 1 may provide an image by using the light emitted from an array of a plurality of pixels P that are two-dimensionally arranged in the display area DA. The peripheral area NDA may be a type of non-display area in which no display elements are arranged, and the display area DA may be entirely surrounded by the peripheral area NDA.

While FIG. 1 illustrates the display apparatus 1 having a substantially flat display surface, embodiments are not limited thereto. In other embodiments, the display apparatus 1 may include a three-dimensional display surface or a curved display surface.

When the display apparatus 1 includes a three-dimensional display surface, the display apparatus 1 may include a plurality of display areas indicating and/or facing different directions and may include, for example, a polygonal columnar display surface. In other embodiments, when the display apparatus 1 includes a curved display surface, the display apparatus 1 may be implemented in various forms such as flexible, foldable, and rollable display apparatuses.

Also, as an embodiment, FIG. 1 illustrates the display apparatus 1 that may take the form of or be implemented as a mobile phone terminal. The mobile phone terminal may be constructed by arranging electronic modules, a camera module, a power module, and the like mounted on a main board, together with the display apparatus 1 in a bracket/case or the like. The display apparatus 1 also may take the form of or be implemented as large electronic apparatuses such as televisions or monitors and small and medium electronic apparatuses such as tablets, car navigations, game machines, or smart watches.

FIG. 1 illustrates a case where the display area DA of the display apparatus 1 has a generally tetragonal shape with rounded corners; however, in other embodiments, the shape of the display area DA may also be circular, elliptical, or polygonal such as triangular or pentagonal.

Hereinafter, an organic light emitting display apparatus is described as an example of the display apparatus 1. However, embodiments are not limited thereto. In other embodiments, the display apparatus 1 may be an inorganic light emitting display apparatus (inorganic light emitting display or inorganic EL display apparatus) or a display apparatus such as a quantum dot light emitting display apparatus. For example, an emission layer of a display element included in the display apparatus 1 may include an organic material, may include an inorganic material, may include quantum dots, may include an organic material and quantum dots, or may include an inorganic material and quantum dots.

Figure 2:
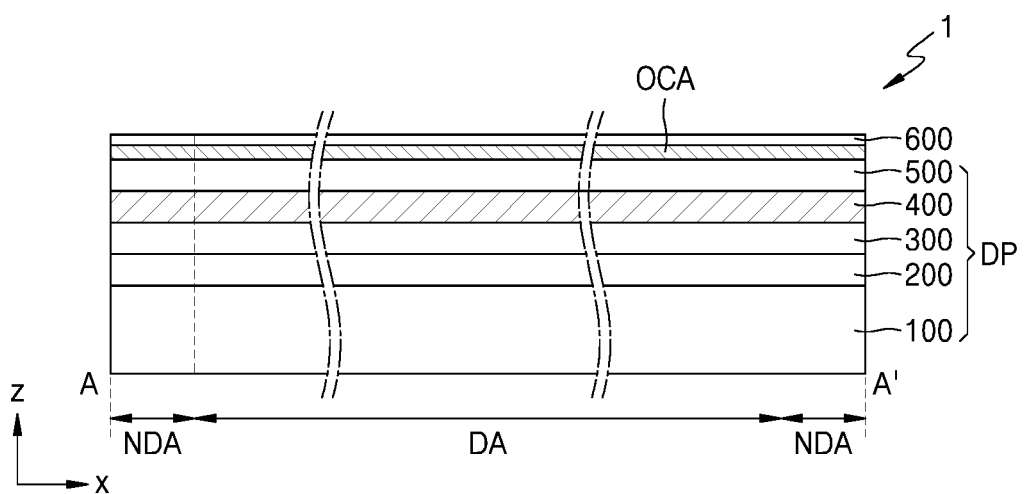
FIG. 2 is a cross-sectional view taken along line A-A' of FIG. 1.

FIG. 2 is a cross-sectional view taken along line A-A' of FIG. 1.

Referring to FIG. 2, the display apparatus 1 may include a substrate 100, a display layer 200, a thin film encapsulation layer 300, an input sensing layer 400, and an anti-reflection layer 500, and a window layer 600. At least some components among the display layer 200, the input sensing layer 400, the anti-reflection layer 500, and the window layer 600 arranged over the substrate 100 may be formed by a continuous process, or at least some components thereof may be coupled to each other through an adhesive member. In FIG. 2, an optical clear adhesive member OCA is illustrated as an example of the adhesive member. The adhesive member described below may include a general adhesive or a removable adhesive. In an embodiment, the anti-reflection layer 500 and the window layer 600 may be replaced with other components or may be omitted.

The display layer 200 may include a plurality of pixels P described above with reference to FIG. 1. The thin film encapsulation layer 300 may be arranged to encapsulate a display element included in each of the plurality of pixels P, for example, an organic light emitting diode OLED (see FIG. 3). The thin film encapsulation layer 300 may include at least one inorganic encapsulation layer and/or at least one organic encapsulation layer.

The display layer 200 may generate an image, and the input sensing layer 400 may acquire coordinate information of an external input (e.g., a touch event). A display panel DP may further include a protection member arranged at the rear surface of the substrate 100. The protection member and the substrate 100 may be coupled through an adhesive member.

In an embodiment, the input sensing layer 400 may be directly arranged on the thin film encapsulation layer 300. Herein, "a component B is directly arranged on a component A" may mean that a separate adhesive layer/adhesive member is not arranged between the component A and the component B. The configuration B may be formed through a continuous process on a base surface provided by the component A after the component A is formed. However, in other embodiments, the input sensing layer 400 may not be directly arranged on the thin film encapsulation layer 300 but may be formed through a separate process and then arranged over the thin film encapsulation layer 300 through the above adhesive member.

The display layer 200 and the thin film encapsulation layer 300 arranged over the substrate 100 and the input sensing layer 400 and the anti-reflection layer 500 directly arranged on the thin film encapsulation layer 300 may be collectively defined as the display panel DP.

Figure 8:
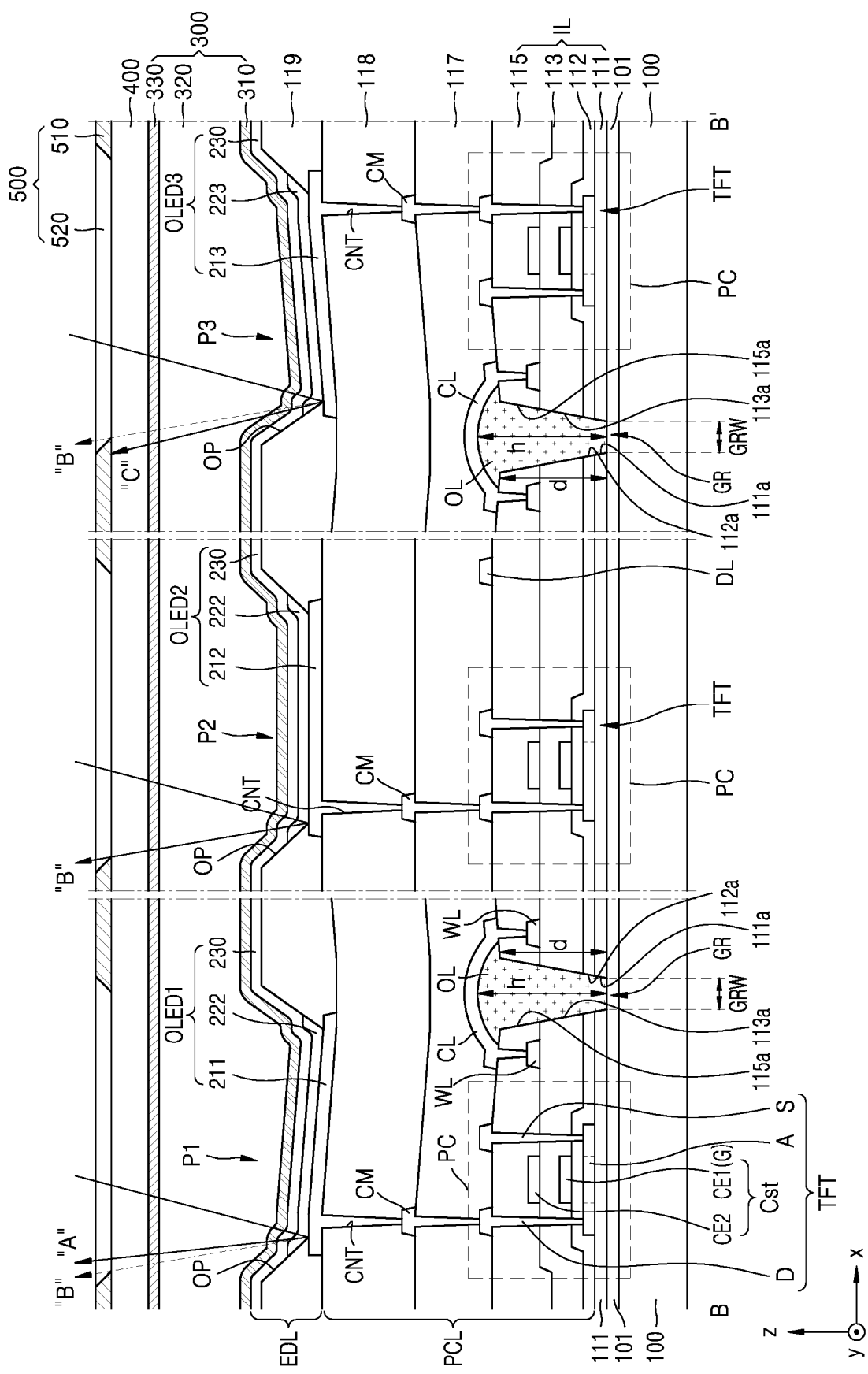
FIG. 8 is a cross-sectional view taken along line B-B' of FIG. 5 to illustrate still another embodiment of the display area.

The anti-reflection layer 500 may reduce the reflectance of external light incident from above the window layer 600. In an embodiment, the anti-reflection layer 500 may include a black matrix 510 and a color filter 520 as illustrated in FIG. 8. The color filter 520 may be arranged to correspond to an emission area of each pixel P, and the black matrix 510 may be arranged to correspond to a non-emission area between the pixels P. In an embodiment, an adhesive member may not be arranged between the input sensing layer 400 and the anti-reflection layer 500, and the anti-reflection layer 500 may be directly arranged on the input sensing layer 400.

Moreover, FIG. 2 illustrates that the anti-reflection layer 500 is arranged over the input sensing layer 400; however, in other embodiments, the anti-reflection layer 500 may be arranged over the thin film encapsulation layer 300, and the input sensing layer 400 may be arranged over the anti-reflection layer 500.

Figure 3A:
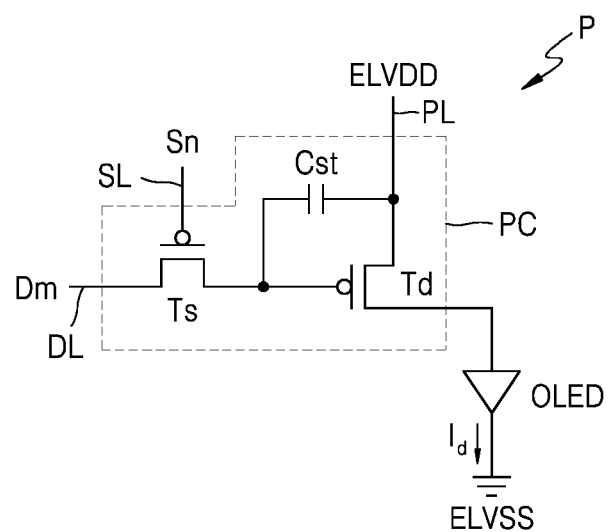
FIGS. 3A and 3B are equivalent circuit diagrams of embodiments of a representative one of the pixels of FIG. 1.
Figure 3B:
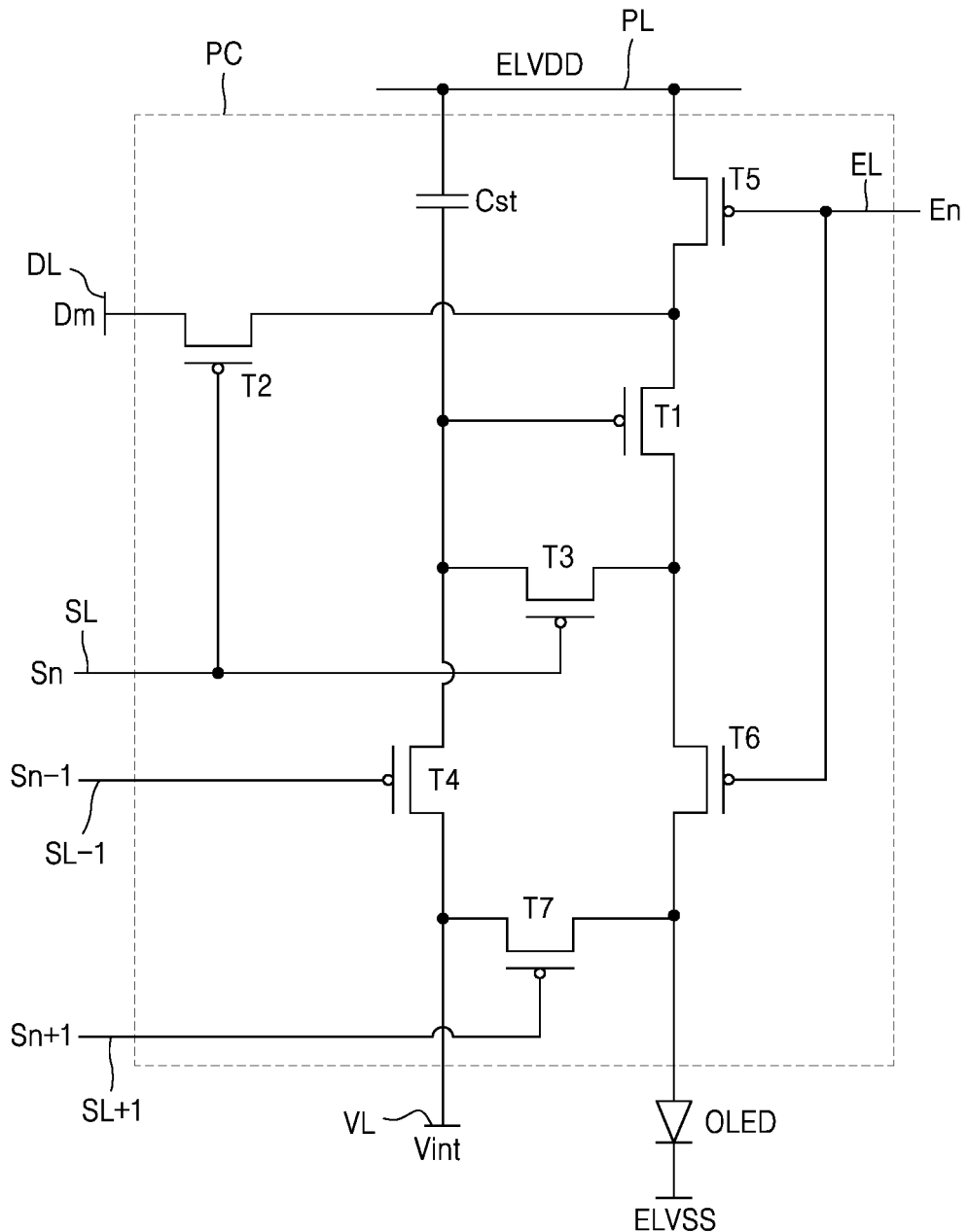

FIGS. 3A and 3B are equivalent circuit diagrams of embodiments of a representative one of the pixels of FIG. 1.

Referring to FIG. 3A, each pixel P may include a pixel circuit PC connected to a scan line SL and a data line DL and an organic light emitting diode OLED as a display device connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL and may be configured to transmit a data signal Dm input through the data line DL to the driving thin film transistor Td according to a scan signal Sn input through the scan line SL.

The storage capacitor Cst may be connected to the switching thin film transistor Ts and a driving voltage line PL and may store a voltage corresponding to the difference between a voltage received from the switching thin film transistor Ts and a driving voltage ELVDD supplied to the driving voltage line PL.

The driving thin film transistor Td may be connected to the driving voltage line PL and the storage capacitor Cst and may control a driving current $I_d$ flowing from the driving voltage line PL through the organic light emitting diode OLED in response to a voltage value stored in the storage capacitor Cst. The organic light emitting diode OLED may emit light with a certain brightness according to the driving current Id.

While FIG. 3A illustrates that the pixel circuit PC includes two thin film transistors and one storage capacitor, embodiments are not limited thereto. In other embodiments, the pixel circuit PC may include seven thin film transistors and one storage capacitor as in FIG. 3B described below. In other embodiments, the pixel circuit PC may include two or more storage capacitors.

Referring to FIG. 3B, a pixel circuit PC may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

While FIG. 3B illustrates that each pixel circuit PC includes signal lines SL, SL−1, SL+1, EL, and DL, an initialization voltage line VL, and a driving voltage line PL, embodiments are not limited thereto. In other embodiments, at least one of the signal lines SL, SL−1, SL+1, EL, and DL and/or the initialization voltage line VL may be shared by adjacent pixel circuits.

The drain electrode of the driving thin film transistor T1 may be electrically connected to an organic light emitting diode OLED via the emission control thin film transistor T6. The driving thin film transistor T1 may receive a data signal Dm according to a switching operation of the switching thin film transistor T2 and supply a driving current to the organic light emitting diode OLED.

The gate electrode of the switching thin film transistor T2 may be connected to the scan line SL and the source electrode thereof may be connected to the data line DL. The drain electrode of the switching thin film transistor T2 may be connected to the driving voltage line PL via the operation control thin film transistor T5 while being connected to the source electrode of the driving thin film transistor T1.

The switching thin film transistor T2 may be turned on according to a scan signal Sn received through the scan line SL, to perform a switching operation of transmitting the data signal Dm transmitted to the data line DL to the source electrode of the driving thin film transistor T1.

The gate electrode of the compensation thin film transistor T3 may be connected to the scan line SL. The source electrode of the compensation thin film transistor T3 may be connected to the pixel electrode of the organic light emitting diode OLED via the emission control thin film transistor T6 while being connected to the drain electrode of the driving thin film transistor T1. The drain electrode of the compensation thin film transistor T3 may be connected to any one electrode of the storage capacitor Cst, the source electrode of the first initialization thin film transistor T4, and the gate electrode of the driving thin film transistor T1. The compensation thin film transistor T3 may be turned on according to the scan signal Sn received through the scan line SL, to connect the gate electrode and the drain electrode of the driving thin film transistor T1 to each other to diode-connect the driving thin film transistor T1.

The gate electrode of the first initialization thin film transistor T4 may be connected to the previous scan line SL−1. The drain electrode of the first initialization thin film transistor T4 may be connected to the initialization voltage line VL. The source electrode of the first initialization thin film transistor T4 may be connected to any one electrode of the storage capacitor Cst, the drain electrode of the compensation thin film transistor T3, and the gate electrode of the driving thin film transistor T1. The first initialization thin film transistor T4 may be turned on according to a previous scan signal Sn−1 received through the previous scan line SL−1, to perform an initialization operation of initializing the voltage of the gate electrode of the driving thin film transistor T1 by transmitting an initialization voltage Vint to the gate electrode of the driving thin film transistor T1.

The gate electrode of the operation control thin film transistor T5 may be connected to the emission control line EL. The source electrode of the operation control thin film transistor T5 may be connected to the driving voltage line PL. The drain electrode of the operation control thin film transistor T5 may be connected to the source electrode of the driving thin film transistor T1 and the drain electrode of the switching thin film transistor T2.

The gate electrode of the emission control thin film transistor T6 may be connected to the emission control line EL. The source electrode of the emission control thin film transistor T6 may be connected to the drain electrode of the driving thin film transistor T1 and the source electrode of the compensation thin film transistor T3. The drain electrode of the emission control thin film transistor T6 may be electrically connected to the pixel electrode of the organic light emitting diode OLED. The operation control thin film transistor T5 and the emission control thin film transistor T6 may be simultaneously turned on according to an emission control signal En received through the emission control line EL, such that a driving voltage ELVDD may be transmitted to the organic light emitting diode OLED and a driving current may flow through the organic light emitting diode OLED.

The gate electrode of the second initialization thin film transistor T7 may be connected to the next scan line SL+1. The source electrode of the second initialization thin film transistor T7 may be connected to the pixel electrode of the organic light emitting diode OLED. The drain electrode of the second initialization thin film transistor T7 may be connected to the initialization voltage line VL. The second initialization thin film transistor T7 may initialize the pixel electrode of the organic light emitting diode OLED by being turned on according to a next scan signal Sn+1 received through the next scan line SL+1.

While FIG. 3B illustrates a case where the first initialization thin film transistor T4 and the second initialization thin film transistor T7 are respectively connected to the previous scan line SL−1 and the next scan signal SL+1, embodiments are not limited thereto. In other embodiments, both the first initialization thin film transistor T4 and the second initialization thin film transistor T7 may be connected to the previous scan line SL−1 to be driven according to the previous scan signal Sn−1.

The other electrode of the storage capacitor Cst may be connected to the driving voltage line PL. Any one electrode of the storage capacitor Cst may be connected to the gate electrode of the driving thin film transistor T1, the drain electrode of the compensation thin film transistor T3, and the source electrode of the first initialization thin film transistor T4.

The opposite electrode (e.g., cathode) of the organic light emitting diode OLED may be provided with a common voltage ELVSS. The organic light emitting diode OLED may emit light by receiving a driving current from the driving thin film transistor T1.

The pixel circuit PC is not limited to the number and circuit design of the thin film transistors and storage capacitor described with reference to FIGS. 3A and 3B, and the number and circuit design thereof may be variously modified.

Figure 4:
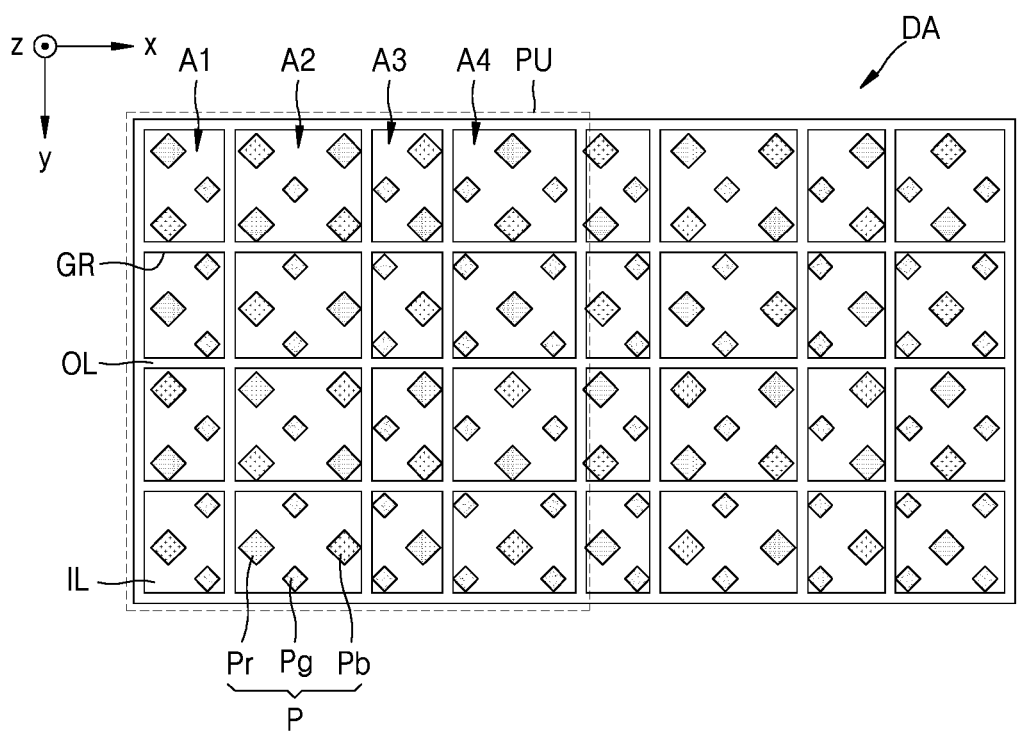
FIG. 4 is a plan view of a portion of an embodiment of a display area constructed according to the principles of the invention.
Figure 5:
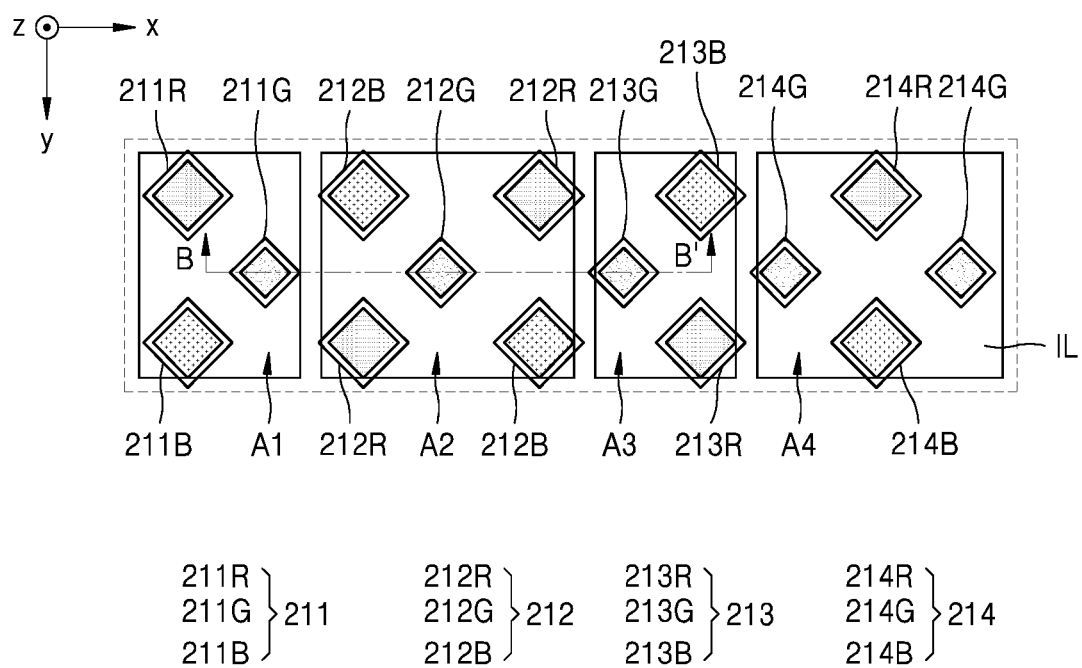
FIG. 5 is an enlarged plan view of the display area of FIG. 4.

FIG. 4 is a plan view of a portion of an embodiment of a display area constructed according to the principles of the invention. FIG. 5 is an enlarged plan view of the display area of FIG. 4.

Referring to FIG. 4, a plurality of pixels P may be two-dimensionally arranged in a display area DA. The plurality of pixels P may include a red pixel Pr, a green pixel Pg, and a blue pixel Pb. In an embodiment, as illustrated in FIG. 4, the red pixel Pr, the green pixel Pg, and the blue pixel Pb may be arranged in a pentile matrix configuration. In other embodiments, the red pixel Pr, the green pixel Pg, and the blue pixel Pb may be arranged in the shape of an elongated bar or stripe.

The red pixel Pr, the green pixel Pg, and the blue pixel Pb may have different sizes (or shapes). For example, the blue pixel Pb may be larger than or equal to the red pixel Pr, and the red pixel Pr and the blue pixel Pb may be larger than the green pixel Pg. In an embodiment, the green pixel Pg may have a generally rectangular shape, and adjacent green pixels Pg may extend in different directions.

In an embodiment, in the plan view, a plurality of pixels P may be arranged in or over a plurality of areas A1 to A4 defined by an elongated recess formed in an inorganic layer, that may be in the form of an opening or groove GR such as a trench, a slit, or a ditch, extending over the display area DA. As such, the display apparatus may include at least one inorganic layer, which may be in the form of the inorganic insulating layer IL including the plurality of areas A1 to A4 and the opening or groove GR defining the plurality of areas A1 to A4. In this case, the plurality of pixels P arranged over the plurality of areas A1 to A4 may refer to emission areas that are externally visible. For example, a display element of a pixel P, such as the organic light emitting diode OLED of FIGS. 3A and 3B, may be arranged in one area, but a pixel circuit of the pixel P such as the pixel circuit PC of FIGS. 3A and 3B may be located in another area adjacent to the one area. Because the plurality of areas A1 to A4 are divided through the opening or groove GR, the pixel circuit and the display element of the pixel P may be located in different areas according to the design rule of the pixel arrangement and/or the opening or groove GR.

In the plan view, the opening or groove GR may have, for example, a generally lattice or a matrix configuration. The opening or groove GR may have "a lattice configuration or shape" such that an orthographic image on the substrate 100 may have a generally lattice shape and the inorganic insulating layer IL may have patterns of generally quadrangular shapes. For example, the lattice shape of the opening or groove GR may be a shape including a branch point having four branches.

The respective portions of the inorganic insulating layer IL divided and surrounded by the opening or groove GR may correspond to the plurality of areas A1 to A4. Each of the plurality of areas A1 to A4 may have an island pattern or an isolated pattern defined by the opening or groove GR surrounding them. An organic material, which is in the form of an organic material layer OL, may be disposed in the opening or groove GR of the inorganic insulating layer IL. The organic material layer OL may have greater flexibility than the inorganic insulating layer IL. As such, as the inorganic insulating layer IL has a plurality of isolated areas through the opening or groove GR of the inorganic insulating layer IL and the organic material layer OL disposed therein, the impact on the display apparatus due to an external shock may be minimized and flexibility enhanced.

The plurality of areas A1 to A4 divided by the opening or groove GR may include a first area A1, a second area A2, a third area A3, and a fourth area A4 that are arranged adjacent to each other in a first direction (e.g., the +x direction). The plurality of areas A1 to A4 may be repeated in a first direction (e.g., the x direction) and a second direction (e.g., the y direction) in the display area DA.

A pixel unit PU including the plurality of areas A1 to A4 may be repeatedly arranged in the display area DA. While FIG. 4 illustrates that the pixel unit PU includes a plurality of areas A1 to A4 disposed in a 4×4 matrix, embodiments are not limited thereto. The pixel unit PU may have an n×m matrix structure ("n" and "m" are integers), where "n" and "m" may be the same integer or different integers. That is, a plurality of areas included in the pixel unit PU is not limited to a particular shape or design. For example, the pixel unit PU may have a structure such as a 2×2, 3×3, 5×5, or 6×6 matrix.

Referring to FIG. 5, a plurality of pixels P may include a plurality of first pixel electrodes 211 arranged over the first area A1, a plurality of second pixel electrodes 212 arranged over the second area A2, a plurality of third pixel electrodes 213 arranged over the third area A3, and a plurality of fourth pixel electrodes 214 arranged over the fourth area A4. Some of the first to fourth pixel electrodes 211, 212, 213, and 214 may overlap the opening or groove GR. A portion of the first to fourth pixel electrodes 211, 212, 213, and 214 overlapping the opening or groove GR may be a portion corresponding to a non-emission area that is not an emission area, and a portion corresponding to the emission area may not overlap the opening or groove GR in terms of the flatness of a lower layer thereof.

The number of pixels arranged over each of at least two of the areas A1 to A4 may not be equal. In other words, the number of pixel electrodes arranged over each of at least two of the areas A1 to A4 may not be equal. For example, the numbers of pixel electrodes (or display elements) arranged over the areas arranged adjacent to each other in the first direction (e.g., the x direction) may be different from each other.

In an embodiment, the numbers of the plurality of first pixel electrodes 211 and the plurality of second pixel electrodes 212 respectively arranged over the first area A1 and the second area A2 adjacent to each other may be different from each other. Also, the numbers of the plurality of second pixel electrodes 212 and the plurality of third pixel electrodes 213 respectively arranged over the second area A2 and the third area A3 adjacent to each other may be different from each other. Also, the numbers of the plurality of third pixel electrodes 213 and the plurality of fourth pixel electrodes 214 arranged over the third area A3 and the fourth area A4 adjacent to each other may be different from each other. In, FIG. 5, the first pixel electrodes 211 includes a red first pixel electrode 211R, a green first pixel electrode 211G, and a blue first pixel electrode 211B, the second pixel electrodes 212 includes two red second pixel electrodes 211R, a green second pixel electrode 212G, and two blue second pixel electrodes 212B, the third pixel electrodes 213 includes a red third pixel electrode 213R, a green third pixel electrode 213G, and a blue third pixel electrode 213B, and the fourth pixel electrodes 214 includes a red fourth pixel electrode 214R, two green pixel electrodes 214G, and a blue fourth pixel electrode 214B.

In an embodiment, the first to fourth areas A1 to A4 may have a pixel arrangement of 3-5-3-4 or 3-4-3-5. For example, the pixel arrangement of 3-5-3-4 may mean that three first pixel electrodes 211 are arranged over the first area A1, five second pixel electrodes 212 are arranged over the second area A2, three third pixel electrodes 213 are arranged over the third area A3, and four fourth pixel electrodes 214 are arranged over the fourth area A4. In this case, "3-5-3-4" and "3-4-3-5" may correspond to the same embodiment. Referring to FIG. 4 described above, the pixel arrangement in the first row of the pixel unit PU may be 3-5-3-4, the pixel arrangement in the second row thereof may be 3-4-3-5, and such pixel arrangements may be repeated in the second direction (e.g., the y direction).

In other embodiments, as in FIG. 9 described below, the first to fourth areas A1 to A4 may have an pixel arrangement of 3-5-4-3 or 3-4-5-3. This will be described in detail with reference to FIG. 9.

Some of the plurality of first to fourth pixel electrodes 211, 212, 213 and 214 may be arranged adjacent to the opening or groove GR. More particularly, in the first area A1, the opening or groove GR may be arranged on the left side (e.g., the −x direction) of the red first pixel electrode 211R and the blue first pixel electrode 211B, and the opening or groove GR may be arranged on the right side (e.g., the +x direction) of the green first pixel electrode 211G.

Accordingly, some of the plurality of first to fourth pixel electrodes 211, 212, 213, and 214 may have a downward, sloping inclination in a direction adjacent to the opening or groove GR. This may be because some of insulating layers arranged around the opening or groove GR are etched in the same process of forming the opening or groove GR, and the plurality of first to fourth pixel electrodes 211, 212, 213, and 214 are located over the etched insulating layers.

Figure 6:
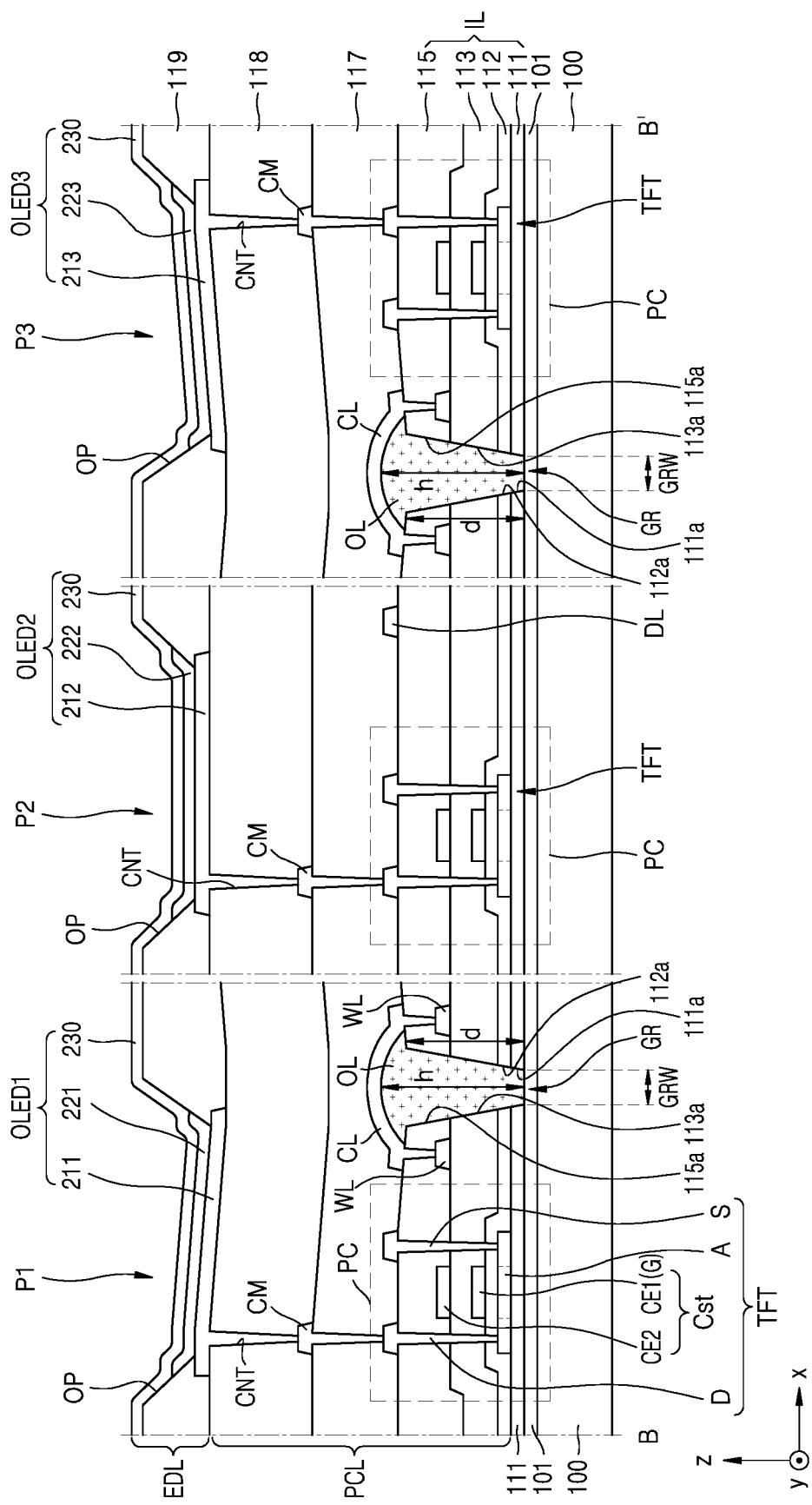
FIG. 6 is a cross-sectional view taken along line B-B' of FIG. 5 to illustrate an embodiment of the display area.

In the display apparatus constructed according to the principles and embodiments of the invention, the plurality of first to fourth pixel electrodes 211, 212, 213, and 214 may be respectively asymmetrically arranged over the first to fourth areas A1 to A4 and thus it may be possible to prevent or minimize color deviation and/or reflection color differences of the display area, which may be caused by the some of the plurality of first to fourth pixel electrodes 211, 212, 213, and 214 having the downward inclination, which is shown, e.g., in FIG. 6.

Figure 7:
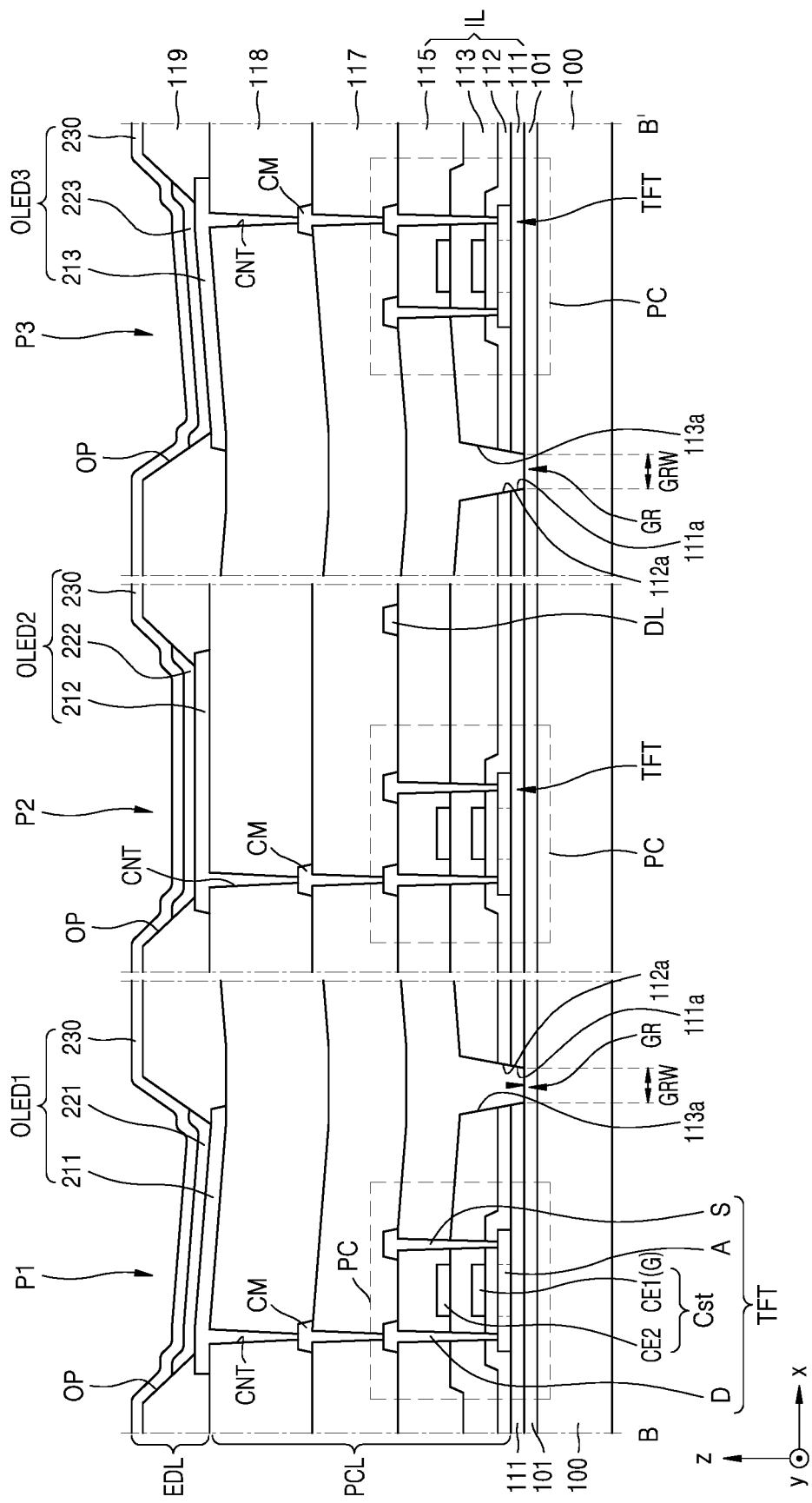
FIG. 7 is a cross-sectional view taken along line B-B' of FIG. 5 to illustrate another embodiment of the display area.

FIG. 6 is a cross-sectional view taken along line B-B' of FIG. 5 to illustrate an embodiment of the display area. FIG. 7 is a cross-sectional view taken along line B-B' of FIG. 5 to illustrate another embodiment of the display area.

Referring to FIG. 6, a plurality of pixels P may be arranged in the display area DA of the display apparatus. FIG. 6 illustrates a first pixel P1, a second pixel P2, and a third pixel P3 having the same color and arranged over the first area A1, the second area A2, and the third area A3 divided through the opening or groove GR. For example, the first pixel P1, the second pixel P2, and the third pixel P3 may be the green first pixel electrode 211G, the green second pixel electrode 212G, and the green third pixel electrode 213G, respectively. The configurations of pixel circuits PC and organic light emitting diodes OLED1, OLED2, and OLED3 included in the respective pixels P1, P2, and P3 may be substantially the same, and thus the following description will be made based on the first pixel P1 to avoid redundancy.

The first pixel P1 may be implemented to include a pixel circuit PC and a display element such as a first organic light emitting diode OLED1 connected to the pixel circuit PC. The first organic light emitting diode OLED1 may include a first pixel electrode 211, a first emission layer 221, and an opposite electrode 230.

In the illustrated embodiment, an organic light emitting diode is used as an example of the display element; however, in other embodiments, any display element such as an inorganic light emitting device or a quantum dot light emitting device may be used as an example of the display element.

Hereinafter, a structure in which the components included in the display apparatus 1 are stacked will be described. The display apparatus 1 may include a stack of a substrate 100, a barrier layer 101, a buffer layer 111, a circuit layer PCL, and a display element layer EDL.

The substrate 100 may include an insulating material such as glass, quartz, or polymer resin. In some embodiments, the substrate 100 may include an inorganic insulating layer and an organic insulating layer that are alternately arranged. The substrate 100 may include a flexible substrate capable of bending, folding, rolling, or the like.

The buffer layer 111 may be located over the substrate 100 to reduce or block the penetration of foreign materials, moisture, or external air from the bottom of the substrate 100 and may provide a flat surface over the substrate 100. The buffer layer 111 may include an inorganic material such as oxide or nitride, an organic material, or an organic/inorganic composite and may include a single-layer or multi-layer structure of an inorganic material and an organic material. In an embodiment, the buffer layer 111 may include silicon oxide ($SiO_X$), silicon nitride ($SiN_X$), and/or silicon oxynitride ($SIO_XN_Y$).

The barrier layer 101 may be arranged between the substrate 100 and the buffer layer 111 and may function to block the penetration of external air. The barrier layer 101 may include silicon oxide ($SiO_X$), silicon nitride ($SiN_X$), and/or silicon oxynitride ($SIO_XN_Y$).

The circuit layer PCL may be arranged over the buffer layer 111 and may include a pixel circuit PC, a first gate insulating layer 112, a second gate insulating layer 113, an interlayer insulating layer 115, a first insulating layer 117, and a second insulating layer 118. The pixel circuit PC may include a thin film transistor TFT and a storage capacitor Cst.

A thin film transistor TFT may be arranged over the buffer layer 111. The thin film transistor TFT may include a semiconductor layer A, a gate electrode G, a source electrode S, and a drain electrode D. The thin film transistor TFT may be connected to the first organic light emitting diode OLED1 of the first pixel P1 to drive the first organic light emitting diode OLED1.

The semiconductor layer A may be arranged over the buffer layer 111 and may include polysilicon. In other embodiments, the semiconductor layer A may include amorphous silicon. In other embodiments, the semiconductor layer A may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A may include a channel area and a source area and a drain area that are doped with dopants.

A first gate insulating layer 112 may be provided to cover the semiconductor layer A. The first gate insulating layer 112 may include an inorganic insulating material such as silicon oxide ($SiO_X$), silicon nitride ($SiN_X$), silicon oxynitride ($SIO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multiple layer including the above inorganic insulating material.

A gate electrode G may be arranged over the first gate insulating layer 112 to overlap the semiconductor layer A. The gate electrode G may include molybdenum (Mo), aluminum (Al), copper (Cu), titanium (Ti), or the like and may include a single layer or a multiple layer. For example, the gate electrode G may include a single layer of Mo.

A second gate insulating layer 113 may be provided to cover the gate electrode G. The second gate insulating layer 113 may include an inorganic insulating material such as silicon oxide ($SiO_X$), silicon nitride ($SiN_X$) silicon oxynitride ($SIO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multiple layer including the above inorganic insulating material.

An upper electrode CE2 of the storage capacitor Cst may be arranged over the second gate insulating layer 113. The upper electrode CE2 may overlap the gate electrode G thereunder. The gate electrode G and the upper electrode CE2 overlapping each other with the second gate insulating layer 113 therebetween may constitute the storage capacitor Cst. The gate electrode G may be a lower electrode CE1 of the storage capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multiple layer of the above material. In an embodiment, the upper electrode CE2 may include a single layer of Mo.

A line WL may be located on one side of the upper electrode CE2. The line WL may be arranged over the second gate insulating layer 113 that is the same layer as the upper electrode CE2. In other embodiments, the line WL may be arranged over another one of inorganic insulating layers, other than the second gate insulating layer 113. The line WL may be at least one of the signal lines SL, SL−1, SL+1, EL, and DL and the voltage lines VL and PL described above with reference to FIG. 3A or 3B. For example, the line WL may be the scan line SL.

An interlayer insulating layer 115 may be formed to cover the upper electrode CE2. The interlayer insulating layer 115 may include silicon oxide ($SiO_x$), silicon nitride ($SiN_x$), silicon oxynitride ($SIO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or a multiple layer including the above inorganic insulating material.

The inorganic insulating layer IL of FIGS. 4 and 5 may include one or more inorganic insulating layers of the circuit layer PCL, such as the buffer layer 111, the first gate insulating layer 112, the second gate insulating layer 113, and the interlayer insulating layer 115.

In other embodiments, the interlayer insulating layer 115 may include an organic insulating material. The interlayer insulating layer 115 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer.

When the interlayer insulating layer 115 includes an organic insulating material, a portion of the interlayer insulating layer 115 may be disposed in the opening or groove GR as in FIG. 7. In this case, the opening or groove GR may include openings 111a, 112a, and 113a formed in the buffer layer 111, the first gate insulating layer 112, and the second gate insulating layer 113 arranged under the interlayer insulating layer 115.

A data line DL, a source electrode S, and a drain electrode D may be arranged over the interlayer insulating layer 115. The data line DL, the source electrode S, and the drain electrode D may include a conductive material including molybdenum (Mo), aluminum (Al), copper (Cu), titanium (Ti), or the like and may include a single layer or a multiple layer including the above material. For example, the data line DL, the source electrode S, and the drain electrode D may include a multilayer structure of Ti/Al/Ti.

A first insulating layer 117 may be arranged to cover the data line DL, the source electrode S, and the drain electrode D. The first insulating layer 117 may have a flat upper surface such that the components arranged thereover may be formed flat.

The first insulating layer 117 may include an organic material or an inorganic material and may have a single-layer structure or a multilayer structure. The first insulating layer 117 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer. Moreover, the first insulating layer 117 may include an inorganic insulating material such as silicon oxide ($SiO_x$), silicon nitride ($SiN_x$), silicon oxynitride ($SIO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). When the first insulating layer 117 is formed, after a layer is formed, chemical mechanical polishing may be performed on an upper surface of the layer to provide a flat upper surface.

A connection electrode CM may be arranged over the first insulating layer 117. The connection electrode CM may be configured to electrically connect the pixel circuit PC to the first organic light emitting diode OLED1. That is, the first insulating layer 117 may have a via hole exposing any one of the source electrode S and the drain electrode D, and the connection electrode CM may be electrically connected to the thin film transistor TFT by contacting the source electrode S or the drain electrode through the via hole. Also, the first pixel electrode 211 of the first organic light emitting diode OLED1 may be connected to the connection electrode CM.

A second insulating layer 118 may be arranged over the circuit layer PCL. The second insulating layer 118 may be arranged to cover the connection electrode CM arranged over the first insulating layer 117. The second insulating layer 118 may function to provide a flat surface such that the first pixel electrode 211 may be arranged thereon.

A contact hole CNT exposing the connection electrode CM may be provided in the second insulating layer 118. The first organic light emitting diode OLED1 may be connected to the pixel circuit PC through the contact hole CNT. The contact hole CNT may be formed through a photoresist patterning and etching process after the second insulating layer 118 is stacked.

A display element layer EDL may be arranged over the second insulating layer 118. The display element layer EDL may include a first organic light emitting diode OLED1 and a pixel definition layer 119.

The first pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 211 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 211 may have a structure including layers formed of ITO, IZO, ZnO, or $In_2O_3$ over/under the reflection layer. In this case, the first pixel electrode 211 may have a stack structure of ITO/Ag/ITO.

The first pixel electrode 211 may be connected to the connection electrode CM through the contact hole CNT defined in the second insulating layer 118.

The pixel definition layer 119 may cover an edge of the first pixel electrode 211 over the second insulating layer 118 and may include an opening OP exposing a central portion of the first pixel electrode 211. An emission area of the first organic light emitting diode OLED1 may be defined by the opening OP.

The pixel definition layer 119 may increase the distance between the edge of the first pixel electrode 211 and the opposite electrode 230 over the first pixel electrode 211 to prevent an arc or the like from occurring at the edge of the first pixel electrode 211. The pixel definition layer 119 may be formed of an organic insulating material such as polyimide, polyamide, acrylic resin, benzocyclobutene, hexamethyldisiloxane (HMDSO), or phenol resin by spin coating or the like.

A first emission layer 221 formed to correspond to the first pixel electrodes 211 may be arranged in the opening OP of the pixel definition layer 119. The first emission layer 221 may include a high molecular weight material or a low molecular weight material and may emit red, green, blue, or white light.

An organic functional layer may be arranged over and/or under the first emission layer 221. The organic functional layer may be a single layer or a multiple layer including an organic material. The organic functional layer may include a hole injection layer (HIL), a hole transport layer (HTL), an electron transport layer (ETL), and/or an electron injection layer (EIL). The organic functional layer may be integrally formed to correspond commonly to the organic light emitting diodes OLED1, OLED2, and OLED3 arranged in the display area DA.

An opposite electrode 230 may be arranged over the first emission layer 221. The opposite electrode 230 may include a conductive material having a low work function. For example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ over the (semi)transparent layer including the above material. The opposite electrode 230 may be integrally formed to correspond to the organic light emitting diodes OLED1, OLED2, and OLED3 arranged in the display area DA.

A capping layer including an organic material may be formed over the opposite electrode 230. The capping layer may be provided to protect the opposite electrode 230 and improve light extraction efficiency. The capping layer may include an organic material having a higher refractive index than the opposite electrode 230.

Also, a thin film encapsulation layer 300 may be arranged as an encapsulation member over the display element layer EDL as in FIG. 8. That is, the organic light emitting diodes OLED1, OLED2, and OLED3 may be encapsulated by the thin film encapsulation layer 300. The thin film encapsulation layer 300 may prevent external moisture or foreign substances from penetrating into the organic light emitting diodes OLED1, OLED2, and OLED3. The thin film encapsulation layer 300 may include at least one inorganic encapsulation layer 310 and 330 and at least one organic encapsulation layer 320. In an embodiment, the thin film encapsulation layer 300 may include a stack of a first inorganic encapsulation layer 310, an organic encapsulation layer 320, and a second inorganic encapsulation layer 330.

The first inorganic encapsulation layer 310 and the second inorganic encapsulation layer 330 may include one or more inorganic insulating materials such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by chemical vapor deposition (CVD) or the like. The organic encapsulation layer 320 may include a polymer-based material. The polymer-based material may include silicon-based resin, acryl-based resin, epoxy-based resin, polyimide, polyethylene, or the like.

Moreover, in the illustrated embodiment of the display apparatus, the inorganic insulating layer IL may include an opening or groove GR in an area between a plurality of pixel circuits PC. An organic material layer OL may be disposed in the opening or groove GR. Also, a connection line CL may be arranged over the organic material layer OL.

In an embodiment, the buffer layer 111, the first gate insulating layer 112, the second gate insulating layer 113, and the interlayer insulating layer 115 arranged under the connection line CL and including an inorganic material may be collectively referred to as an inorganic insulating layer IL. The inorganic insulating layer IL may include an opening or groove GR in an area between adjacent pixel circuits.

FIG. 6 illustrates that the inorganic insulating layer IL includes an opening or groove GR. In this manner, at least a portion of the barrier layer 101 thereunder may be exposed through the opening GR formed in the inorganic insulating layer IL. The opening GR may include openings 111a, 112a, 113a, and 115a respectively defined in the buffer layer 111, the first gate insulating layer 112, the second gate insulating layer 113, and the interlayer insulating layer 115.

Moreover, when the inorganic insulating layer IL is defined as including the barrier layer 101, the inorganic insulating layer IL may be understood as including a groove GR in an area between adjacent pixels. The groove GR may refer to a trench formed in the inorganic insulating layer IL.

However, the inorganic insulating layer IL may include various other types of opening or grooves. For example, a portion of the upper surface of the barrier layer 101 may be removed, or various modifications may be possible; for example, the lower surface of the buffer layer 111 may remain without being removed.

The width of the groove GR of the inorganic insulating layer IL may be several μm. For example, a width GRW of the groove GR of the inorganic insulating layer IL may have a value between about 5 μm and about 10 μm.

In order to form the opening or groove GR, a separate mask process and an etching process may be performed after the interlayer insulating layer 115 is formed. The openings 111a, 112a, 113a, and 115a of the buffer layer 111, the first gate insulating layer 112, the second gate insulating layer 113, and the interlayer insulating layer 115 may be formed by an etching process. For example, the etching process may be a dry etching process.

The opening or groove GR of the inorganic insulating layer IL may be filled with the organic material layer OL. The connection line CL may be located over the organic material layer OL in an area where the organic material layer OL exists. The organic material layer OL and the opening or groove GR of the inorganic insulating layer IL may exist at least partially between a plurality of pixel circuits.

The organic material layer OL and the opening or groove GR of the inorganic insulating layer IL may be introduced to minimize the impact on the display apparatus due to an external shock. Because the inorganic insulating layer IL includes an opening or groove GR in an area between a plurality of pixel circuits PC and the organic material layer OL fills the opening or groove GR, even when there is an external shock, the probability of crack propagation may be extremely low. Also, because the organic material layer OL has a lower hardness than the inorganic insulating layer IL, the organic material layer OL may absorb a stress caused by an external shock and thus the concentration of the stress on the connection line CL located over the organic material layer OL may be effectively dispersed.

The organic material layer OL may be arranged between the pixel circuits PC to fill at least a portion of the opening or groove GR of the inorganic insulating layer IL. The organic material layer OL may not completely fill the opening or groove GR. However, in order to absorb an external shock, the organic material layer OL may completely fill the opening or groove GR. In an embodiment, the organic material layer OL may be formed to extend to the upper surface of the inorganic insulating layer IL. In this case, due to the characteristics of the organic material layer OL, the upper surface of the organic material layer OL may have a generally convex shape. That is, a maximum height h of the organic material layer OL may be greater than a depth d of the opening or groove GR.

The organic material layer OL may include at least one of acryl, metacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

The connection line CL may be arranged over the organic material layer OL to connect the plurality of pixel circuits PC to each other. The connection line CL may be located over the inorganic insulating layer IL in a place where the organic material layer OL does not exist. The connection line CL may function as a line for transmitting an electrical signal to the plurality of pixel circuits PC.

The connection line CL may include a material having a high stretchability such that a defect such as a crack or a disconnection may not occur in the connection line CL. In an embodiment, the connection line CL may include a stacked structure of Ti/Al/Ti. Also, the stretchability of the connection line CL may be higher than the stretchability of the conductive layers arranged thereunder.

Moreover, as a portion of the inorganic insulating layer IL around the opening or groove GR is partially etched and/or removed in the process of forming the opening or groove GR, the upper surface of the inorganic insulating layer IL around the opening or groove GR may have an inclined surface inclined downward toward the opening or groove GR. Also, the first insulating layer 117 and the second insulating layer 118 arranged over the inorganic insulating layer IL may have an inclined surface formed along the inclined surface of the upper surface of the inorganic insulating layer IL.

As the second insulating layer 118 has the inclined surface, the first pixel electrode 211 disposed on the second insulating layer 118 may also have an inclined surface formed along the inclined surface of the second insulating layer 118. Referring to FIGS. 5 and 6, because the first pixel electrode 211 is adjacent to the opening or groove GR on its right side (e.g., the first direction or the +x direction), the first pixel electrode 211 may have a downward inclination toward its right side. Similarly, because the third pixel electrode 213 has is adjacent to the opening or groove GR on its left side (e.g., the direction opposite to the first direction or the −x direction), the third pixel electrode 213 may have a downward inclination toward its left side. Because the second pixel electrode 212 is arranged at a central portion of the second area A2 and is relatively far from the opening or groove GR, the second pixel electrode 212 may be arranged over the flat second insulating layer 118 without being affected by the opening or groove GR.

In an embodiment, the first pixel electrode 211 may have an inclination of about 0.5° to about 1° with respect to a plane, that is, the upper surface of the substrate 100. for example, a first portion of the first pixel electrode 211 adjacent to the opening or groove GR and a second portion of the first pixel electrode 211 relatively far from the opening or groove GR may have a height difference of about 100 nm to about 200 nm therebetween. This may also be true in the third pixel electrode 213. The display apparatus 1 may have a high resolution of, for example, about 500 ppi or more, and in this case, the height difference of the first pixel electrode 211 in which a color deviation does not occur may be about 50 nm or less, for example, about 20 nm or less.

As a comparative example, if the first pixel electrode and the third pixel electrode, which have the same color, are inclined in the same direction (e.g., the right or left direction), a deviation in luminance and a deviation in color may occur because a portion of the light may be lost by the black matrix of the anti-reflection layer thereover when the first pixel electrode and the third pixel electrode reflects the light incident from a particular position.

According to an embodiment, the pixel unit PU may include pixel electrodes having the same color and being inclined toward opposite sides, and the pixel electrodes (e.g., the first pixel electrodes 211) having inclinations in a certain direction (e.g., the first direction or the +x direction) and the pixel electrodes (e.g., the third pixel electrodes 213) having inclinations in the opposite direction (e.g., the direction opposite to the first direction or the −x direction) may be provided in the same number in the ratio of 1:1 such that the pixel electrodes having inclinations toward the opposite sides to each other may complement and offset each other with respect to the color deviation and/or luminance deviation to prevent or minimize the occurrence of the luminance deviation, the color deviation, and/or reflection color differences of the display area DA. In order to have the same number of the pixel electrodes having inclinations toward the opposite sides to each other, in the display apparatus 1, a plurality of first to fourth pixel electrodes 211, 212, 213, and 214 may be respectively asymmetrically arranged over the first to fourth areas A1 to A4.

FIG. 8 is a cross-sectional view taken along line B-B' of FIG. 5 to illustrate still another embodiment of the display area.

The structure of FIG. 8 may further include a thin film encapsulation layer 300, an input sensing layer 400, and an anti-reflection layer 500 over the structure of FIG. 6. The display element layer EDL including the circuit layer PCL and the organic light emitting diode OLED may be covered by the thin film encapsulation layer 300. The structures of the circuit layer PCL and the display element layer EDL may be the same as those described above with reference to FIGS. 6 and 7, and the structure over the thin film encapsulation layer 300 will be described below.

The thin film encapsulation layer 300 may include first and second inorganic encapsulation layers 310 and 330 and an organic encapsulation layer 320 therebetween. The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through chemical vapor deposition.

The organic encapsulation layer 320 may include a polymer-based material. The polymer-based material may include acryl-based resin, epoxy-based resin, polyimide, polyethylene, or the like. For example, the organic encapsulation layer 320 may include acryl-based resin such as polymethylmethacrylate or polyacrylic acid. The organic encapsulation layer 320 may be formed by curing a monomer or applying a polymer.

The input sensing layer 400 may include a first conductive layer and a second conductive layer including a sensing electrode and/or a trace line. In an embodiment, a first insulating layer may be arranged between the thin film encapsulation layer 300 and the first conductive layer, and a second insulating layer may be arranged between the first conductive layer and the second conductive layer.

The first conductive layer and the second conductive layer may include a conductive material. The conductive material may include molybdenum (Mo), aluminum (Al), copper (Cu), titanium (Ti), or the like and may include a single layer or a multiple layer including the above material. For example, the first conductive layer and the second conductive layer may have a structure in which a titanium layer, an aluminum layer, and a titanium layer are sequentially stacked (Ti/Al/Ti).

The first insulating layer and the second insulating layer may include an inorganic insulating material and/or an organic insulating material. The inorganic insulating material may include silicon oxide, silicon oxynitride, silicon nitride, or the like. The organic insulating material may include an acryl-based organic material or an imide-based organic material.

An anti-reflection layer 500 may be arranged over the input sensing layer 400. The anti-reflection layer 500 may include a black matrix 510 and a color filter 520. The color filter 520 may be arranged over the emission area of the organic light emitting diode OLED defined by the opening OP of the pixel definition layer 119. The color filter 520 may have a red, green, or blue pigment or dye depending on the color of light emitted from the organic light emitting diode OLED.

The black matrix 510 may be located in the non-emission area and may surround the emission area. In an embodiment, the black matrix 510 may passivate a touch electrode of the input sensing layer 400. For example, the black matrix 510 may overlap the second conductive layer of the input sensing layer 400 including the touch electrode, and the second conductive layer may be covered by the black matrix 510. The black matrix 510 may include an insulating material (e.g., an organic insulating material) including a pigment or dye having a black color.

As described above with reference to FIG. 6, some (e.g., the first pixel electrode 211 and the third pixel electrode 213) of the pixel electrodes 211, 212, and 213 of the pixels P1, P2, and P3 may have a downward inclination in the first direction (e.g., the +x direction) or in the direction (e.g., the −x direction) opposite to the first direction, and thus the angle of reflected light with respect to incident light may be different between the first pixel P1 and the third pixel P3.

In FIG. 8, the light incident on the second pixel electrode 212 having no inclination may propagate along a "B" path. For example, when the incident light of the second pixel electrode 212 is incident at an angle of about 30°, the reflected light thereof may also be reflected at an angle of about 30°.

In the case of the first pixel electrode 211 having a downward inclination in the first direction (e.g., the +x direction), the light incident on the first pixel electrode 211 may propagate along an "A" path. For example, when the incident light of the first pixel electrode 211 is incident at an angle of about 30°, the reflected light thereof may be reflected at an angle less than about 30°. As such, when light is incident from the inclined side, the reflected light may not reach the black matrix 510, and therefore, there may be no change in the amount of light of the pixel.

On the other hand, in the case of the third pixel electrode 213 having a downward inclination in the direction (e.g., the −x direction) opposite to the first direction, the light incident on the third pixel electrode 213 may propagate along a "C" path. For example, when the incident light of the third pixel electrode 213 is incident at an angle of about 30°, the reflected light thereof may be reflected at an angle greater than about 30°, and in this case, the amount of reflected light may be partially reduced by the black matrix 510 located thereover. As such, when light is incident from the side opposite to the inclined side, the amount of light of the pixel may be reduced. As such, the color of the light reflected from the display may vary depending on the incident angle and direction of the light.

According to the principles and an illustrative embodiment of the invention, the first pixel electrodes 211 and the third pixel electrodes 213 inclined toward the opposite sides in the pixel unit PU may be provided in the same number such that the occurrence of a color deviation and/or a reflection color difference, which may be caused by reduction of the amount of light of the pixel emitting a particular color, may be prevented or minimized. While the foregoing description has been made based on the pixel electrodes 211, 212, and 213 of the green pixels Pg, this may also be true in the red pixels Pr and the blue pixels Pb. In the pixel unit PU, the numbers of the red pixels Pr inclined toward the opposite sides may be equal to each other, the numbers of the green pixels Pg inclined toward the opposite sides may be equal to each other, and the numbers of the blue pixels Pb inclined toward the opposite sides may be equal to each other. As such, as the numbers of the pixels inclined toward the opposite sides are equal to each other in the pixels emitting the same color, the ratio of reducing the amount of light for each color may be substantially the same, thereby preventing or minimizing the occurrence of the color deviation and/or the reflection color difference in the display area DA. Thus, the display apparatus 1 may have the improved external visibility.

Figure 9:
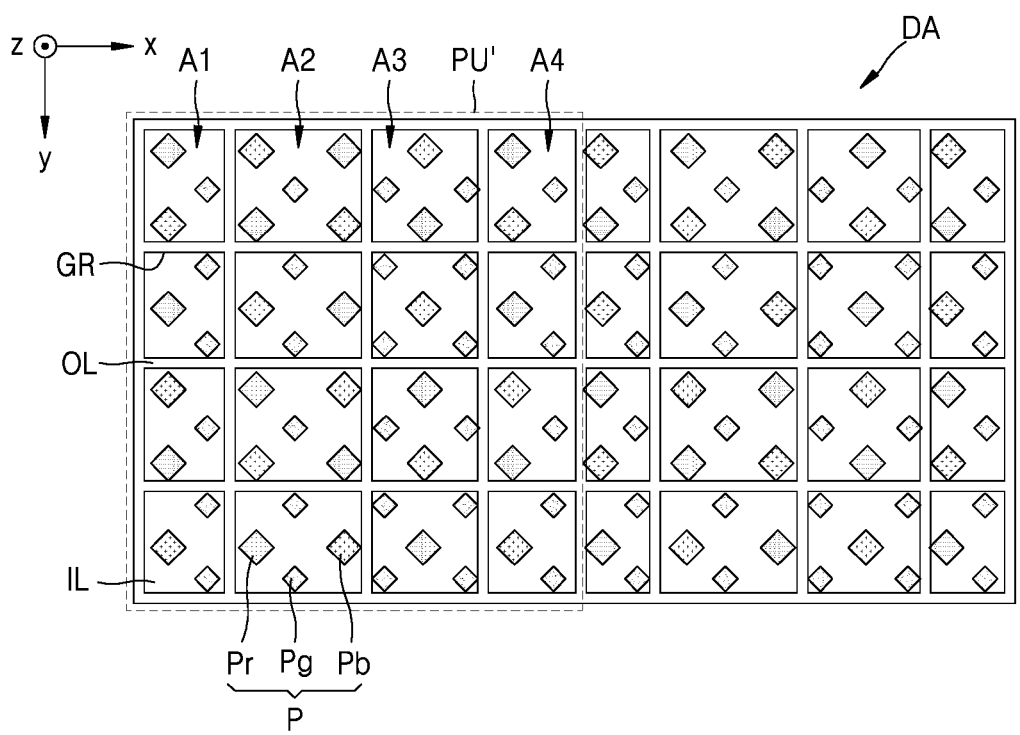
FIGS. 9 and 10 are plan views of a portion of other embodiments of a display area constructed according to the principles of the invention.
Figure 10:
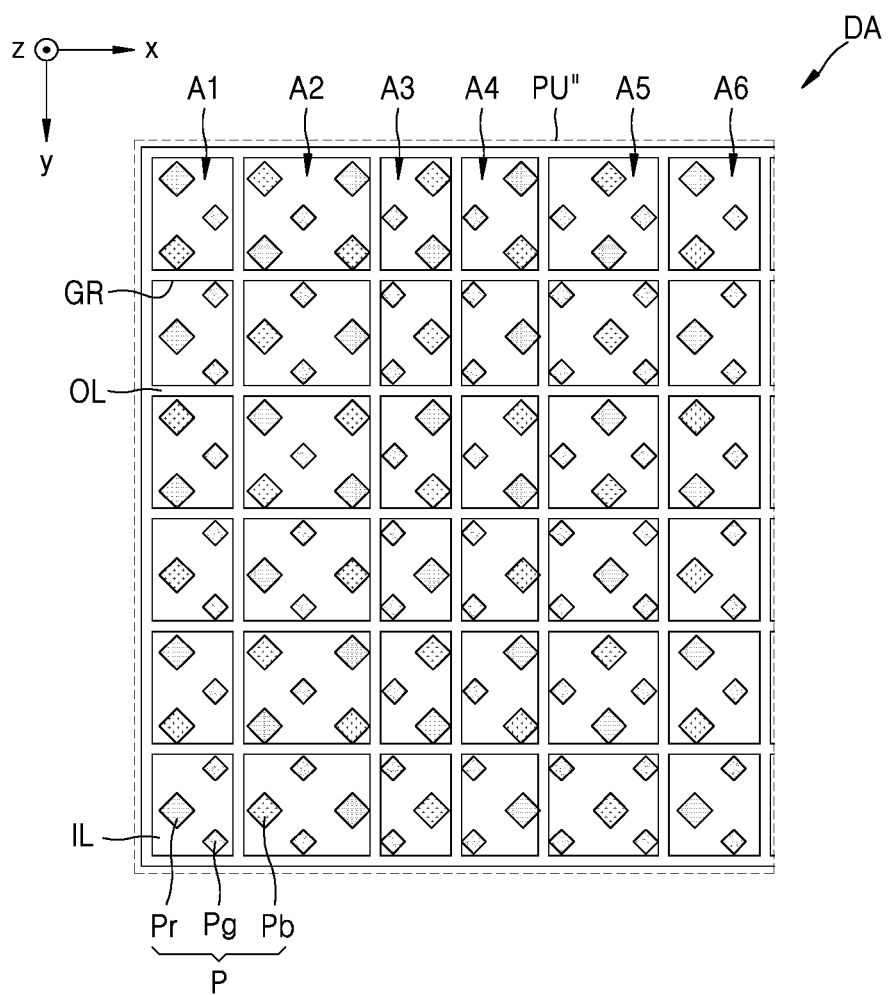

FIGS. 9 and 10 are plan views of a portion of other embodiments of a display area constructed according to the principles of the invention.

The same reference numerals in FIGS. 9 and 10 may refer to the same components as those in FIGS. 4 to 8 described above. Thus, hereinafter, the differences therebetween will be mainly described to avoid redundancy.

Referring to FIG. 9, a plurality of pixels P may be two-dimensionally arranged in a display area DA. The plurality of pixels P may include a red pixel Pr, a green pixel Pg, and a blue pixel Pb. In the plan view, a plurality of pixels P may be arranged over a plurality of areas A1 to A4 divided through an opening or groove GR formed in an inorganic insulating layer IL.

In the plan view, the opening or groove GR may have, for example, a generally lattice shape. The respective portions of the inorganic insulating layer IL divided and surrounded by the opening or groove GR may correspond to the plurality of areas A1 to A4. Each of the plurality of areas A1 to A4 may have an island pattern or an isolated pattern by the opening or groove GR surrounding them. An organic material layer OL may be disposed in the opening or groove GR of the inorganic insulating layer IL.

The plurality of areas A1 to A4 divided by the opening or groove GR may include a first area A1, a second area A2, a third area A3, and a fourth area A4 that are arranged adjacent to each other in the first direction (e.g., the +x direction). The plurality of areas A1 to A4 may be repeated in at least one or more rows to form a pixel unit PU'. While FIG. 9 illustrates that the pixel unit PU' has a 4×4 matrix, embodiments are not limited thereto. In other embodiments, the pixel unit PU' may have a 6×6 matrix as in FIG. 10.

The number of pixels arranged over each of the areas A1 to A4 may not be equal. That is, the numbers of pixels (i.e., display elements) arranged over the areas arranged adjacent to each other in the first direction (e.g., the x direction) may be different from each other.

In an embodiment, the numbers of a plurality of first pixels P1 and a plurality of second pixels P2 respectively arranged over the first area A1 and the second area A2 adjacent to each other may be different from each other. Also, the numbers of a plurality of second pixels P2 and a plurality of third pixels P3 respectively arranged over the second area A2 and the third area A3 adjacent to each other may be different from each other. Also, the numbers of a plurality of third pixels P3 and a plurality of fourth pixels P4 arranged over the third area A3 and the fourth area A4 adjacent to each other may be different from each other.

In an embodiment, as illustrated in FIG. 9, the first to fourth areas A1 to A4 may have a pixel arrangement of 3-5-4-3 or 3-4-5-3. For example, the pixel arrangement of 3-5-4-3 may mean that three first pixels P1 are arranged over the first area A1, five second pixels P2 are arranged over the second area A2, four third pixels P3 are arranged over the third area A3, and three fourth pixels P4 are arranged over the fourth area A4. In this case, "3-5-4-3" and "3-4-5-3" may correspond to the same embodiment. As illustrated in FIG. 9, the pixel arrangement of pixels arranged in the first row of the pixel unit PU' may be 3-5-4-3, and the pixel arrangement of pixels arranged in the second row may be 3-4-5-3.

Referring to FIG. 10, in the plan view, a plurality of pixels P may be arranged over a plurality of areas A1 to A6 divided through an opening or groove GR formed in an inorganic insulating layer IL. That is, in FIG. 10, a pixel unit PU'' may be different from the above pixel units PU and PU' in that one row thereof includes first to sixth areas A1 to A6. Thus, the pixel unit PU'' of FIG. 10 may have a 6×6 matrix form, and this structure of the pixel unit PU'' may be repeated in a display area DA.

The respective portions of the inorganic insulating layer IL divided and surrounded by the opening or groove GR may correspond to the plurality of areas A1 to A6. Each of the plurality of areas A1 to A6 may have an island pattern or an isolated pattern by the opening or groove GR surrounding them.

The plurality of areas A1 to A6 divided by the opening or groove GR may include a first area A1, a second area A2, a third area A3, a fourth area A4, a fifth area A5, and a sixth area A6 that are arranged adjacent to each other in the first direction (e.g., the +x direction).

The number of pixels arranged over each of the areas A1 to A6 may not be equal in at least some areas. In an embodiment, the numbers of pixels (i.e., display elements) arranged over the first to sixth areas A1 to A6 arranged adjacent to each other in the first direction (e.g., the x direction) may be different from each other at least in some areas.

For example, the numbers of a plurality of first pixels P1 and a plurality of second pixels P2 respectively arranged over the first area A1 and the second area A2 adjacent to each other may be different from each other. Also, the numbers of a plurality of second pixels P2 and a plurality of third pixels P3 respectively arranged over the second area A2 and the third area A3 adjacent to each other may be different from each other. Also, the numbers of a plurality of fourth pixels P4 and a plurality of fifth pixels P5 respectively arranged over the fourth area A4 and the fifth area A5 adjacent to each other may be different from each other. Also, the numbers of a plurality of fifth pixels P5 and a plurality of sixth pixels P6 arranged over the fifth area A5 and the sixth area A6 adjacent to each other may be different from each other.

In an embodiment, as illustrated in FIG. 10, the first to sixth areas A1 to A6 may have a pixel arrangement of 3-5-3-3-4-3 or 3-4-3-3-5-3. The pixel arrangement of 3-5-3-3-4-3 may mean that three first pixels P1 are arranged over the first area A1, five second pixels P2 are arranged over the second area A2, three third pixels P3 are arranged over the third area A3, three fourth pixels P4 are arranged over the fourth area A4, four fifth pixels P5 are arranged over the fifth area A5, and three sixth pixels P6 are arranged over the sixth area A6. In this case, "3-5-3-3-4-3" and "3-4-3-3-5-3" may correspond to the same embodiment.

In the illustrated embodiments of FIGS. 9 and 10 described above, including FIG. 4 described above, because the opening or groove GR is not externally visible, the arrangement of pixels P over the display area DA may be substantially the same while the arrangement of the pixels P in each of the pixel units PU, PU', and PU'' is different from each other. The pixel arrangement in each of the pixel units PU, PU', and PU'' may be determined by the position of the opening or groove GR such that some of the areas of the pixel unit may have different numbers of pixels. Through the pixel arrangement, pixels inclined toward the opposite sides for each color may be eventually provided in the same number in the pixel unit to prevent or minimize a relative decrease or increase in the amount of light of the pixel emitting a particular color.

Figure 11:
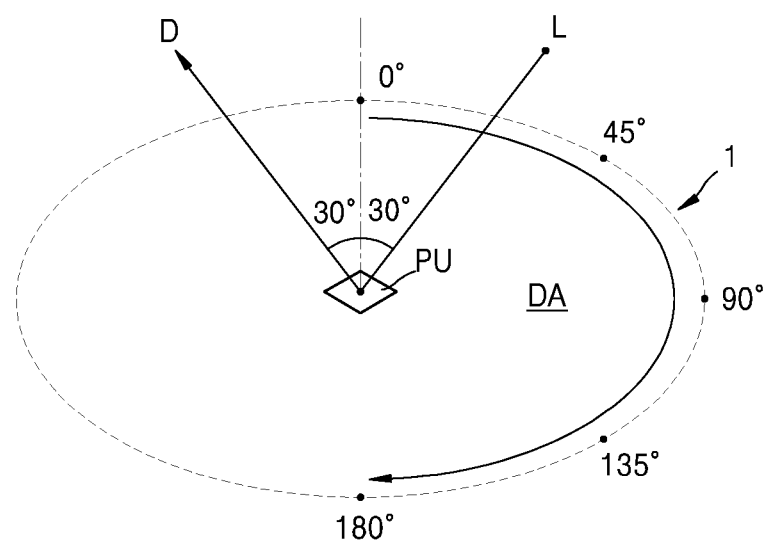
FIG. 11 is a schematic diagram illustrating a test method to measure reflection color differences of a display area.

FIG. 11 is a schematic diagram for illustrating a test method to measure reflection color differences of a display area. FIGS. 12A to 12E are plan views of the pixel unit of FIG. 4 to illustrate reflection color differences of the pixel unit for each rotation angle derived in the test process of FIG. 11. FIG. 13 is a table schematically illustrating reflection color differences of the pixel unit for each rotation angle derived in the test process of FIG. 11.

Referring to FIG. 11, external light is incident on the pixel unit PU located over the display area DA of the display apparatus 1. A light source L may be incident on the display area DA at an angle of about 30°, and the light reflected from the display area DA may be received by a detector D. For example, in the case of a pixel not having an inclination in one direction like the second pixel electrode 212 in FIG. 6 described above, the reflected light may be reflected at an angle of about 30° like the incident light.

Hereinafter, in FIGS. 12A to 12E, the display area DA is rotated at 0°, 45°, 90°, 135°, and 180° in the two-dimension view, and then a reflection color difference of the pixel unit PU is measured for each angle. In this case, the positions of the light source L and the detector D may be fixed. In FIGS. 12A to 12E, it may be understood that an arrow (→) represented in each pixel indicates an inclination propagation direction ("high"→"low") like the first pixel P1 and the third pixel P3 in FIG. 6 and a dot (•) indicates a pixel having no inclination like the second pixel P2 in FIG. 6.

Moreover, in FIGS. 12A to 12E, a test is performed based on the pixel unit PU of FIG. 4 described above; however, the test results described below are also the same for the pixel units PU' and PU" of FIGS. 9 and 10.

Figure 12A:
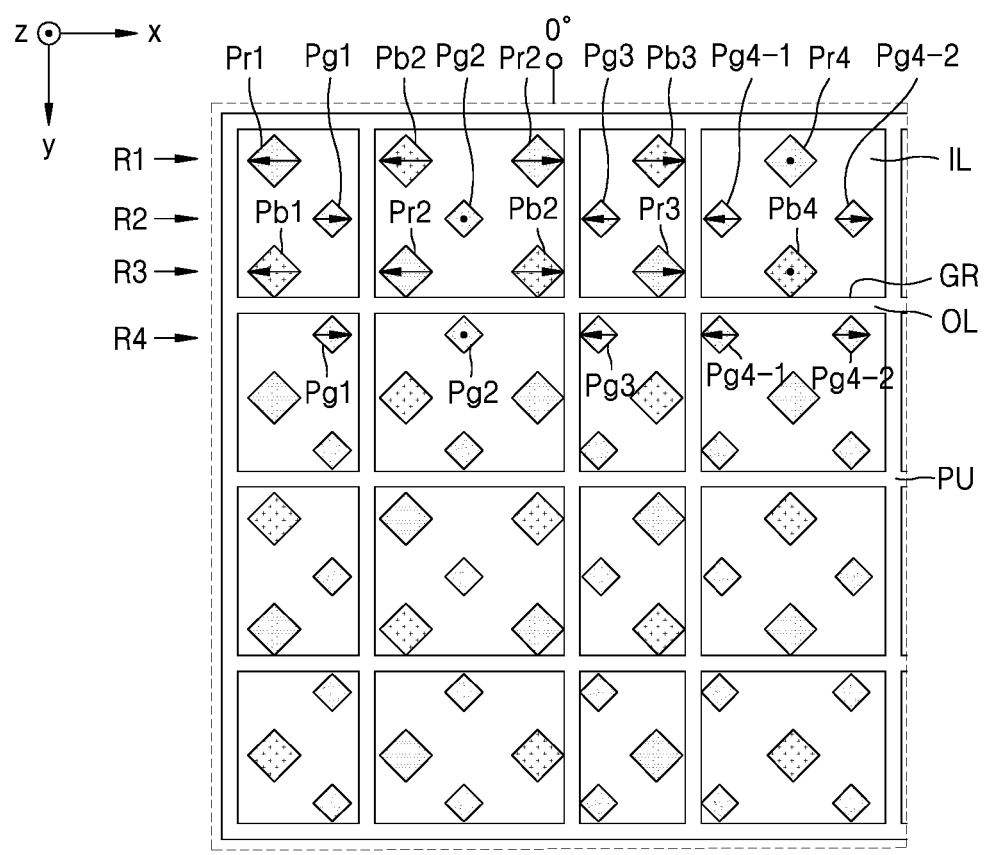
FIGS. 12A to 12E are plan views of the pixel unit of FIG. 4 to illustrate reflection color differences of the pixel unit for each rotation angle derived in the test process of FIG. 11.

Referring to FIGS. 12A and 13, the pixel unit PU may be located at a reference angle, that is, 0°. A first row R1 of the pixel unit PU may include a red first pixel Pr1, a blue second pixel Pb2, a red second pixel Pr2, a blue third pixel Pb3, and a red fourth pixel Pr4 that are consecutively arranged in the first direction (e.g., the x direction). As for the above pixels, with respect to the light source L of FIG. 11, the red first pixel Pr1 and the blue second pixel Pb2 may have an inclination in the left direction (e.g., the direction opposite to the first direction or the −x direction), the red second pixel Pr2 and the blue third pixel Pb3 may have an inclination in the right direction (e.g., the first direction or the +x direction), and the red fourth pixel Pr4 may be neutrally arranged. Thus, it may be seen that an inclination bias of the pixels arranged in the first row R1 converges to zero.

Also, a second row R2 of the pixel unit PU may include a green first pixel Pg1, a green second pixel Pg2, a green third pixel Pg3, and green (4-1)th and (4-2)th pixels Pg4-1 and Pg4-2 that are consecutively arranged in the first direction (e.g., the x direction). As for the above pixels, with respect to the light source L of FIG. 11, the green first pixel Pg1 may have an inclination in the right direction, the green second pixel Pg2 may be neutral, the green third pixel Pg3 and the green (4-1)th pixel Pg4-1 may have an inclination in the left direction, and the green (4-2)th pixel Pg4-2 may have an inclination in the right direction. Thus, it may be seen that an inclination bias of the pixels arranged in the second row R2 converges to zero.

A third row R3 of the pixel unit PU may include a blue first pixel Pb1, a red second pixel Pr2, a blue second pixel Pb2, a red third pixel Pr3, and a blue fourth pixel Pb4 that are consecutively arranged in the first direction (e.g., the x direction). As for the above pixels, with respect to the light source L of FIG. 11, the blue first pixel Pb1 and the red second pixel Pr2 may have an inclination in the left direction, the blue second pixel Pb2 and the red third pixel Pr3 may have an inclination in the right direction, and the blue fourth pixel Pb4 may be neutrally arranged. Thus, it may be seen that an inclination bias of the pixels arranged in the third row R3 converges to zero.

Also, the pixels of a fourth row R4 of the pixel unit PU may have the same inclination bias as the pixels of the second row R2 described above.

While the above description has been made based on the first to fourth rows R1 to R4, the following rows may be the same as the above rows are repeatedly arranged.

As such, by matching the number of pixels having an inclination in the left direction and the number of pixels having an inclination in the right direction in the pixel unit PU, the inclination bias between the pixels may be converged to zero to effectively minimize the occurrence of a color deviation in the display area DA.

Figure 12B:
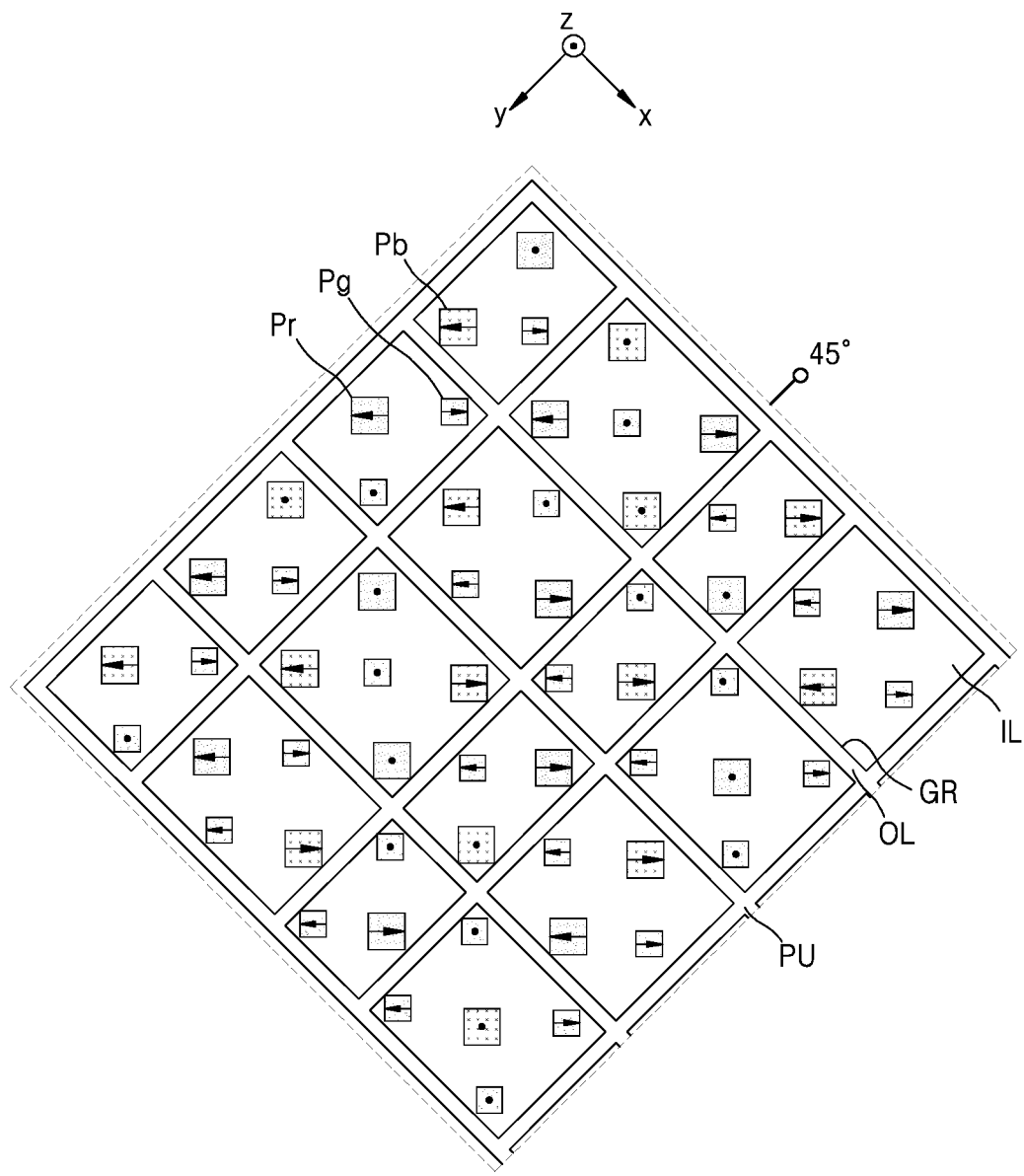

Referring to FIGS. 12B and 13, the pixel unit PU may be rotated by 45° from the reference angle. The pixel unit PU rotated by 45° may still indicate a tendency of inclination to the left or right with respect to the light source L of FIG. 11. In FIG. 12B, in the pixel unit PU, five red pixels Pr having an inclination in the right direction and five red pixels Pr having an inclination in the left direction may be provided, five blue pixels Pb having an inclination in the right direction and five blue pixels Pb having an inclination in the left direction may be provided, and ten green pixels Pg having an inclination in the right direction and ten green pixels Pg having an inclination in the left direction may be provided. Thus, it may be seen that an inclination bias of the pixels in the pixel unit PU converges to zero.

Figure 12C:
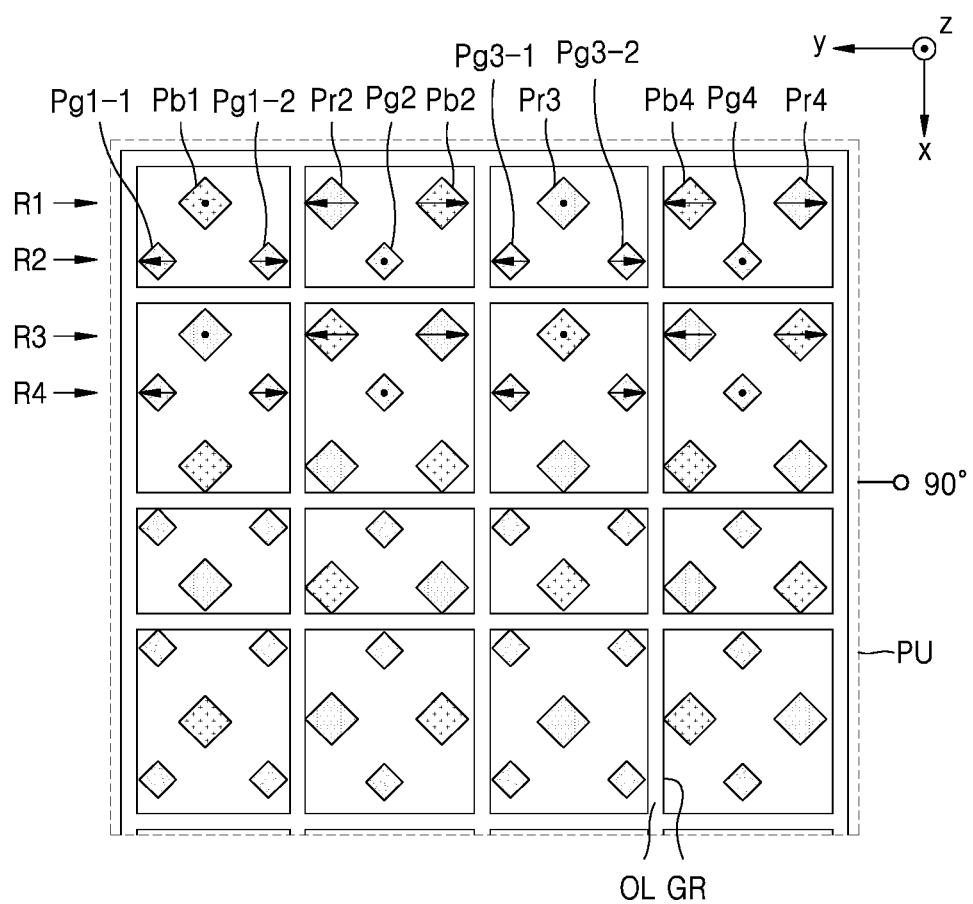

Referring to FIGS. 12C and 13, the pixel unit PU may be rotated by 90° from the reference angle. In FIG. 12C, a first row R1 of the pixel unit PU may include a blue first pixel Pb1, a red second pixel Pr2, a blue second pixel Pb2, a red third pixel Pr3, a blue fourth pixel Pb4, and a red fourth pixel Br4 that are consecutively arranged in the first direction (e.g., the x direction). As for the above pixels, with respect to the light source L of FIG. 11, the red second pixel Pr2 and the blue fourth pixel Pb4 may have an inclination in the left direction, the blue second pixel Pb2 and the red fourth pixel Pr4 may have an inclination in the right direction, and the blue first pixel Pb1 and the red third pixel Pr3 may be neutrally arranged. Thus, an inclination bias of the pixels arranged in the first row R1 may converge to zero.

Also, a second row R2 of the pixel unit PU may include green (1-1)th and (1-2)th pixels Pg1-1 and Pg1-2, a green second pixel Pg2, green (3-1)th and (3-2)th pixels Pg3-1 and Pg3-2, and a green fourth pixel Pg4 that are consecutively arranged in the first direction (e.g., the x direction). As for the above pixels, with respect to the light source L of FIG. 11, the number of pixels having an inclination in the right direction and the number of pixels having an inclination in the left direction may be equal to each other. Thus, an inclination bias of the pixels arranged in the second row R2 may converge to zero.

This arrangement structure may also be similarly applied to a third row R3 and a fourth row R4 of the pixel unit PU.

Figure 12D:
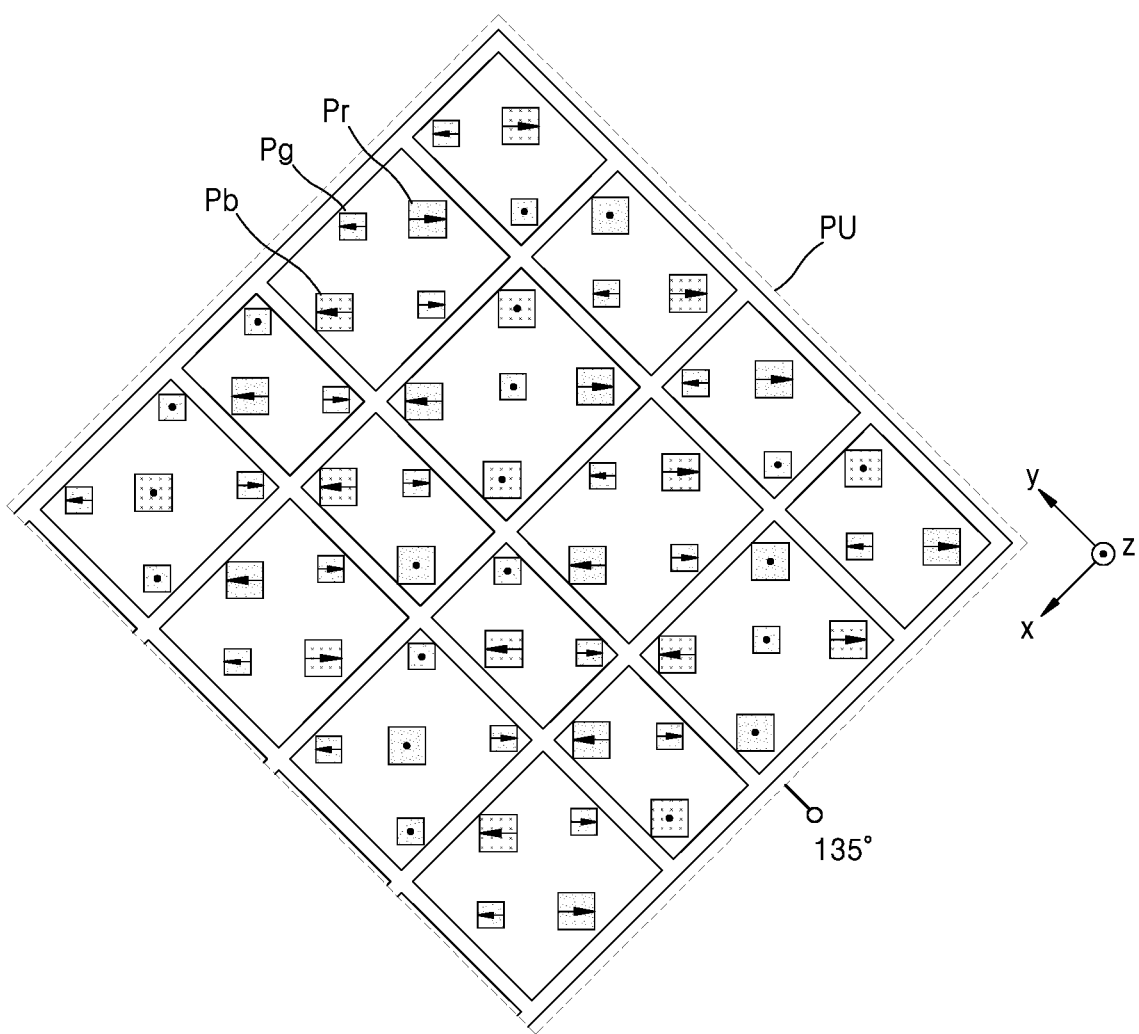

Referring to FIGS. 12D and 13, the pixel unit PU may be rotated by 135° from the reference angle. The pixel unit PU rotated by 135° may still indicate a tendency of inclination to the left or right with respect to the light source L of FIG. 11. In FIG. 12D, in the pixel unit PU, five red pixels Pr having an inclination in the right direction and five red pixels Pr having an inclination in the left direction may be provided, five blue pixels Pb having an inclination in the right direction and five blue pixels Pb having an inclination in the left direction may be provided, and ten green pixels Pg having an inclination in the right direction and ten green pixels Pg having an inclination in the left direction may be provided. Thus, it may be seen that an inclination bias of the pixels in the pixel unit PU converges to zero.

Figure 12E:
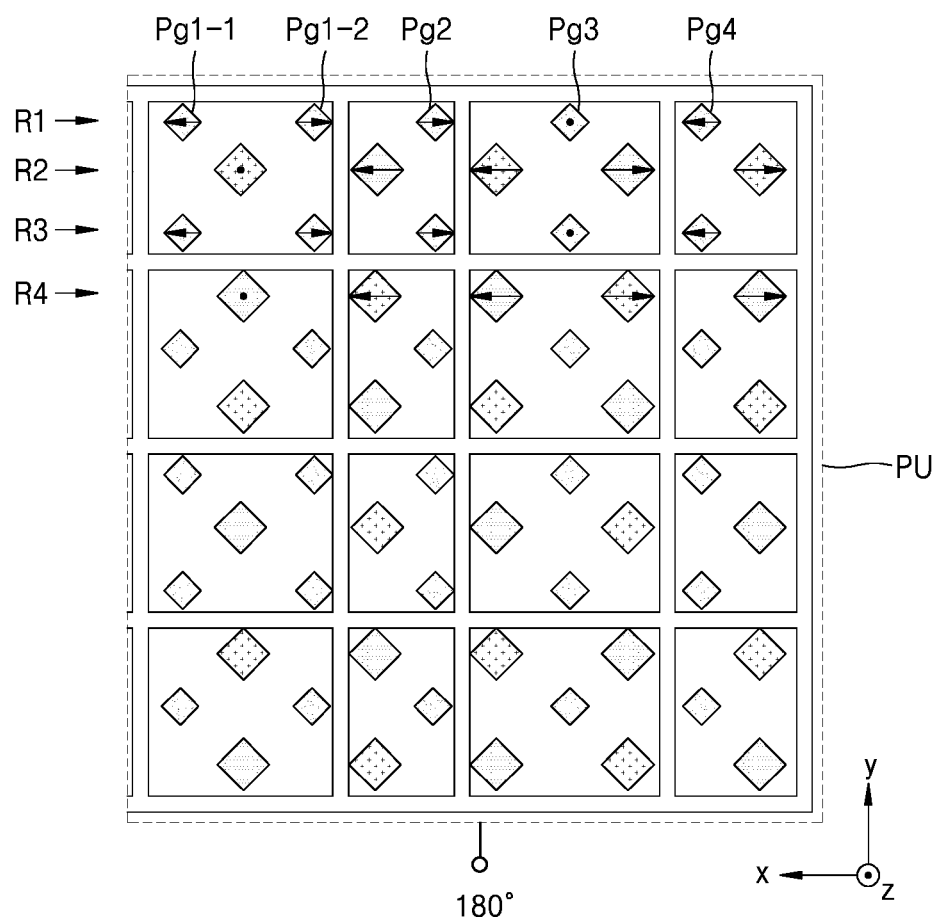

Referring to FIGS. 12E and 13, the pixel unit PU may be rotated by 180° from the reference angle. In FIG. 12E, a first row R1 of the pixel unit PU may include green (1-1)th and (1-2)th pixels Pg1-1 and Pg1-2, a green second pixel Pg2, a green third pixel Pg3, and a green fourth pixel Pg4 that are consecutively arranged in the first direction (e.g., the x direction). As for the above pixels, with respect to the light source L of FIG. 11, the number of pixels having an inclination in the right direction and the number of pixels having an inclination in the left direction may be equal to each other. Thus, an inclination bias of the pixels arranged in the first row R1 may converge to zero.

This configuration may also be similarly applied to a second row R2, a third row R3, and a fourth row R4 of the pixel unit PU.

As described above, the display apparatus 1 constructed according to the principles and embodiments of the invention may display a high quality image even at a high resolution because it has substantially the same inclination bias at all angles and thus prevent or at least reduce color deviation and/or reflection color differences at particular angles.

Figure 14A:
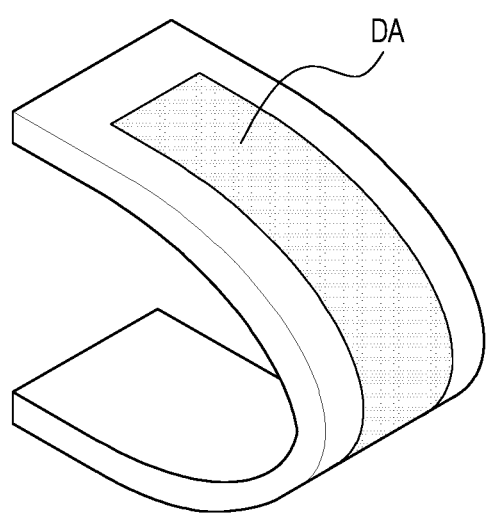
FIGS. 14A and 14B are diagrams of other embodiments of a display apparatus.
Figure 14B:
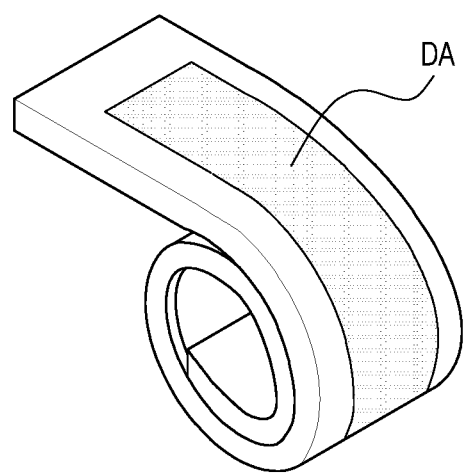

FIGS. 14A and 14B are diagrams of other embodiments of a display apparatus. FIG. 14A illustrates that the display area is folded, and FIG. 14B illustrates that the display area is rolled.

Because the display apparatus is robust against an external shock, the display area DA may be foldable or rollable as illustrated in FIGS. 14A and 14B. That is, as the inorganic insulating layer IL has an opening or groove GR, an organic interlayer insulating layer or an organic material layer filling the opening or groove GR may absorb a tensile stress caused by bending. FIGS. 14A and 14B illustrate a structure in which the display area DA is folded or rolled toward the outer surface; however, in other embodiments, the display area DA may be folded or rolled toward the inner surface such that one portion and another portion of the display area DA may face each other.

Figure 15:
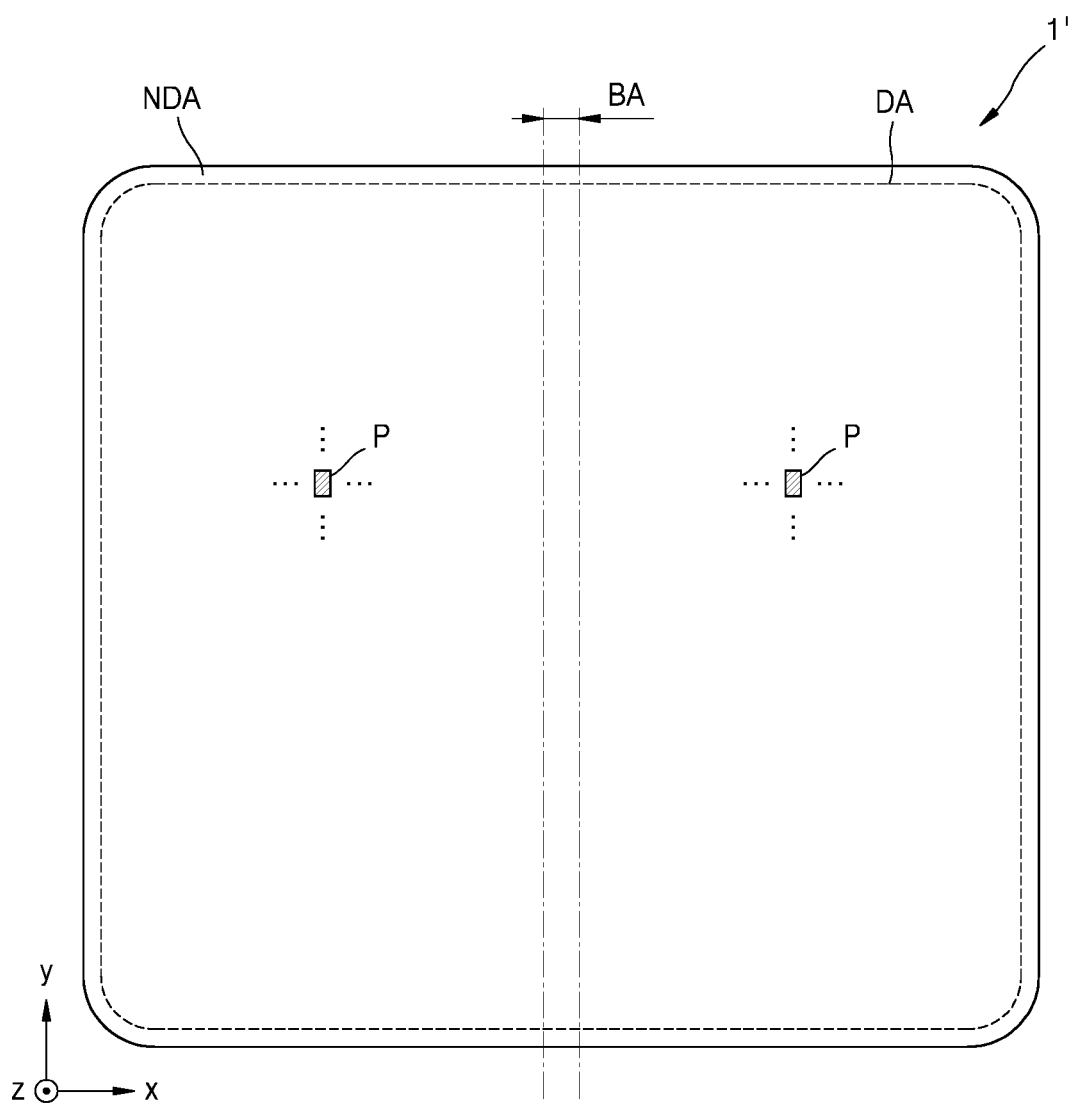
FIG. 15 is a plan view of another embodiment of a display apparatus.

FIG. 15 is a plan view of another embodiment of a display apparatus.

Because the display apparatus is robust against an external shock, it may also be used as a display apparatus 1' having a structure that is foldable in half as illustrated in FIG. 15. The display apparatus 1' may be similar to the display device 1 of FIG. 1 described above but may be further extend in the first direction (e.g., the +x direction). When a user uses the display apparatus 1' of FIG. 15, the display apparatus 1' may be folded along a short-axis parallel to a short side of the display apparatus 1' and the second direction (e.g., the +y direction).

While only the display apparatus has been mainly described above, embodiments are not limited thereto. For example, a method of manufacturing the display apparatus will also be within the scope of the invention.

As described above, according to the illustrated embodiment, it may be possible to implement a display apparatus having improved flexibility and improved external visibility. However, embodiments are not limited to these effects.

Although certain illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate;
   an inorganic layer disposed on the substrate and including a first area, a second area, and an elongated recess, wherein:
      the first area and the second area of the inorganic layer are respectively surrounded by the elongated recess and are isolated from each other by the elongated recess in a plan view,
      a part of the elongated recess is disposed between a first area and a second area, and
      the first area and the second area are adjacent to each other in a first direction;
   an organic material disposed in the elongated recess;
   an organic insulating layer on the organic material and the inorganic layer, wherein an upper surface of the organic insulating layer includes a first inclined portion and a second inclined portion which are inclined with respect to an upper surface of the substrate;
   a plurality of first pixel electrodes directly contacting the first inclined portion of the upper surface of the organic insulating layer and overlapping the first area of the inorganic layer; and
   a plurality of second pixel electrodes directly contacting the second inclined portion of the upper surface of the organic insulating layer and overlapping the second area of the inorganic layer,
   wherein the number of the plurality of first pixel electrodes corresponding to the first area and the number of the plurality of second pixel electrodes corresponding to the second area are different from each other.

2. The display apparatus of claim 1, wherein the elongated recess comprises one or more grooves having a lattice shape.

3. The display apparatus of claim 2, wherein the one or more grooves comprise a branch point having four branches.

4. The display apparatus of claim 1, wherein
   the inorganic layer comprises an inorganic insulating layer and the organic material comprises an organic material layer.

5. The display apparatus of claim 1, further comprising a barrier layer located between the substrate and the inorganic layer,
   wherein the elongated recess exposes at least a portion of the barrier layer.

6. The display apparatus of claim 1, wherein the number of the plurality of first pixel electrodes is three, and the number of the plurality of second pixel electrodes is four or five.

7. The display apparatus of claim 1, wherein at least one of the plurality of second pixel electrodes has a downward inclination in a direction toward the elongated recess.

8. The display apparatus of claim 1, wherein at least one of the plurality of first pixel electrodes includes a first portion adjacent to the elongated recess, a second portion disposed opposite the first portion, and a downward inclination from the second portion toward the first portion.

9. The display apparatus of claim 1, further comprising a plurality of third pixel electrodes and a plurality of fourth pixel electrodes,
   wherein:
      the inorganic layer further includes a third area and a fourth area divided by the elongated recess, the third area and the fourth area being arranged in the first direction, wherein the third area is adjacent to the second area and the second and fourth areas are disposed on opposite sides of the third area, respectively;
      the plurality of third pixel electrodes is arranged over the third area of the inorganic layer;
      the plurality of fourth pixel electrodes is arranged over the fourth area of the inorganic layer; and
      the number of the plurality of third pixel electrodes and the number of the plurality of fourth pixel electrodes are different from each other.

10. The display apparatus of claim 9, wherein the number of the plurality of third pixel electrodes is three, and the number of the plurality of fourth pixel electrodes is four or five.

11. The display apparatus of claim 9, wherein the number of the plurality of third pixel electrodes is four or five, and the number of the plurality of fourth pixel electrodes is three.

12. The display apparatus of claim 9, wherein the first to fourth areas are sequentially arranged in the first direction in at least one or more rows in a second direction intersecting with the first direction, and
   the first to the fourth areas comprise a repeating unit pattern of 4×4 matrix.

13. The display apparatus of claim 12, wherein the plurality of first pixel electrodes, the plurality of second pixel electrodes, the plurality of third pixel electrodes, and the plurality of fourth pixel electrodes are included in a plurality of pixels of the repeating unit pattern, a ratio of the number of pixels of a first color including pixel electrodes having a downward inclination in the first direction to the number of pixels of the first color including pixel electrodes having a downward inclination in a second direction opposite to the first direction is about 1:1.

14. The display apparatus of claim 1, further comprising a plurality of third pixel electrodes, fourth pixel electrodes, fifth pixel electrodes, and sixth pixel electrodes,
wherein:
the inorganic layer further includes third fourth to sixth areas divided by the elongated recess, the third fourth to sixth areas being arranged adjacent to the second area in the first direction;
the plurality of third pixel electrodes is arranged over the third area of the inorganic layer;
the plurality of fourth pixel electrodes is arranged over the fourth area of the inorganic layer;
the plurality of fifth pixel electrodes is arranged over the fifth area of the inorganic layer;
the plurality of sixth pixel electrodes is arranged over the sixth area of the inorganic layer; and
the number of the plurality of third pixel electrodes is equal to the number of the plurality of fourth pixel electrodes.

15. The display apparatus of claim 14, wherein the number of the plurality of fifth pixel electrodes and the number of the plurality of sixth pixel electrodes are different from each other.

16. The display apparatus of claim 14, wherein the number of the plurality of third pixel electrodes, the number of the plurality of fourth pixel electrodes, and the number of the plurality of sixth pixel electrodes are each 3, and the number of the plurality of fifth pixel electrodes is four or five.

17. The display apparatus of claim 1, wherein the plurality of first pixel electrodes and the plurality of second pixel electrodes are arranged in a pentile type pattern.

18. The display apparatus of claim 1, further comprising a line to apply signal or voltage, the line being arranged in the first direction or in a second direction intersecting the first direction,
wherein at least a portion of the line is arranged across the organic material.

19. The display apparatus of claim 1, further comprising a plurality of third pixel electrodes disposed between the first and second pixel electrodes and having a substantially flat inclination.

20. The display apparatus of claim 1, further comprising a plurality of third pixel electrodes disposed in a third area and a plurality of fourth pixel electrodes disposed in a fourth area, the third and fourth areas being arranged in the same row as the first and second area, and wherein the first, second, third, and fourth pixel electrodes are asymmetrically arranged in their respective areas.

21. A display apparatus comprising:
a circuit layer disposed on a substrate and including a plurality of first pixel circuits, a plurality of second pixel circuits, and at least one inorganic layer including a recess, a portion of the recess disposed between the plurality of first pixel circuits, and the plurality of second pixel circuits;
an organic material disposed in the recess;
an organic insulating layer on the organic material and the inorganic layer, wherein an upper surface of the organic insulating layer includes a first inclined portion and a second inclined portion which are inclined with respect to an upper surface of the substrate;
a plurality of first display elements directly contacting the first inclined portion of the upper surface of the organic insulating layer and electrically connected to the plurality of first pixel circuits; and
a plurality of second display elements adjacent to the plurality of first display elements directly contacting the second inclined portion of the upper surface of the organic insulating layer, the plurality of second display elements being electrically connected to the plurality of second pixel circuits,
wherein the number of the plurality of first display elements corresponding to a first area of the at least one inorganic layer and the number of the plurality of second display elements corresponding to a second area of the at least one inorganic layer are different from each other, and wherein the first area, the second area of the inorganic layer are respectively surrounded by the recess and are isolated from each other by the recess in a plan view.

22. The display apparatus of claim 21, further comprising a plurality of third pixel electrodes disposed between the first and second pixel electrodes and having a substantially flat inclination.

23. The display apparatus of claim 21, further comprising a plurality of third display elements disposed in a third area and a plurality of fourth display elements disposed in a fourth area, the third and fourth areas being arranged in the same row as the first and second area, and wherein the first, second, third and fourth display elements are asymmetrically arranged in their respective areas.

24. A display apparatus comprising:
a substrate including a display area;
an inorganic layer disposed on the substrate and including a plurality of areas and a recess dividing the plurality of areas into a lattice shape;
an organic material disposed in the recess;
an organic insulating layer on the organic material and the inorganic layer, wherein an upper surface of the organic insulating layer includes a first inclined portion and a second inclined portion which are inclined with respect to an upper surface of the substrate; and
a plurality of pixel electrodes arranged over the upper surface of the organic insulating layer and overlapping the plurality of areas, wherein the plurality of pixel electrodes includes:
a plurality of first pixel electrodes directly contacting a first inclined portion of the upper surface of the organic insulating layer, wherein an upper surface of each of the plurality of first pixel electrodes has a downward inclination in a first direction, and
a plurality of second pixel electrodes directly contacting a second inclined portion of the upper surface of the organic insulating layer, wherein an upper surface of each of the plurality of second pixel electrodes has a downward inclination in a second direction opposite to the first direction.

25. The display apparatus of claim 24, wherein a ratio of the number of the plurality of first pixel electrodes to the number of the plurality of second pixel electrodes is about 1:1.

26. The display apparatus of claim 24, wherein the plurality of first pixel electrodes adjacent to the recess in the first direction, and the plurality of second pixel electrodes adjacent to the recess in the second direction have downward inclinations toward the recess.

27. The display apparatus of claim 24, further comprising a plurality of third pixel electrodes disposed between the first and second pixel electrodes and having a substantially flat inclination.

28. The display apparatus of claim 24, further comprising a plurality of third pixel electrodes disposed in a third area and a plurality of fourth pixel electrodes disposed in a fourth area, the third and fourth areas being arranged in the same row as the first and second area, and wherein the first, second, third and fourth pixel electrodes are asymmetrically arranged in their respective areas.

* * * * *